(12) United States Patent
Sun et al.

(10) Patent No.: US 9,281,296 B2
(45) Date of Patent: Mar. 8, 2016

(54) DIE STACKING TECHNIQUES IN BGA MEMORY PACKAGE FOR SMALL FOOTPRINT CPU AND MEMORY MOTHERBOARD DESIGN

(71) Applicant: Invensas Corporation, San Jose, CA (US)

(72) Inventors: Zhuowen Sun, Campbell, CA (US); Yong Chen, Palo Alto, CA (US); Kyong-Mo Bang, Fremont, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

(21) Appl. No.: 14/448,040

(22) Filed: Jul. 31, 2014

(65) Prior Publication Data

US 2016/0035703 A1 Feb. 4, 2016

(51) Int. Cl.
*H01L 25/00* (2006.01)
*H01L 25/065* (2006.01)
*H01L 23/498* (2006.01)
*H01L 23/00* (2006.01)

(52) U.S. Cl.
CPC ...... *H01L 25/0657* (2013.01); *H01L 23/49816* (2013.01); *H01L 24/48* (2013.01); *H01L 2224/481* (2013.01)

(58) Field of Classification Search
CPC .......... H01L 2924/00; H01L 2224/32225; H01L 2224/48227; H01L 2224/73265; H01L 2924/15311; H01L 2924/00012; H01L 2224/4824; H01L 2224/73215; H01L 2224/16225; H01L 2224/32145; H01L 2224/48091
See application file for complete search history.

(56) References Cited

U.S. PATENT DOCUMENTS 3,670,208 A  6/1972 Hovnanian et al.
4,747,081 A  5/1988 Heilveil et al.
(Continued)

FOREIGN PATENT DOCUMENTS

EP  1205977 A2  5/2002
JP  64-001257 A  1/1989
(Continued)

OTHER PUBLICATIONS

Taiwanese Office Action for Application No. 101136594 dated Aug. 13, 2014.
(Continued)

*Primary Examiner* — Roy Potter
*Assistant Examiner* — Paul Patton
(74) *Attorney, Agent, or Firm* — Lerner, David, Littenberg, Krumholz & Mentlik, LLP

(57) ABSTRACT

A microelectronic package can include a substrate comprising a dielectric element having first and second opposite surfaces, and a microelectronic element having a face extending parallel to the first surface. The substrate can also include a plurality of peripheral edges extending between the first and second surfaces defining a generally rectangular or square periphery of the substrate. The substrate can further include a plurality of contacts and terminals, the contacts being at the first surface, the terminals being at at least one of the first or second surfaces. The microelectronic elements can have a plurality of edges bounding the face, and a plurality of element contacts at the face electrically coupled with the terminals through the contacts of the substrate. Each edge of the microelectronic element can be oriented at an oblique angle with respect to the peripheral edges of the substrate.

23 Claims, 10 Drawing Sheets

(56) References Cited

U.S. PATENT DOCUMENTS

| | | | |
|---|---|---|---|
| 5,148,265 A | 9/1992 | Khandros et al. | |
| 5,148,266 A | 9/1992 | Khandros et al. | |
| 5,163,024 A | 11/1992 | Heilveil et al. | |
| 5,210,639 A | 5/1993 | Redwine et al. | |
| 5,480,840 A | 1/1996 | Barnes et al. | |
| 5,679,977 A | 10/1997 | Khandros et al. | |
| 5,691,570 A | 11/1997 | Kozuka | |
| 5,751,553 A | 5/1998 | Clayton | |
| 5,777,391 A | 7/1998 | Nakamura et al. | |
| 5,821,614 A | 10/1998 | Hashimoto et al. | |
| 5,899,705 A | 5/1999 | Akram | |
| 5,929,517 A | 7/1999 | Distefano et al. | |
| 5,936,305 A | 8/1999 | Akram | |
| 5,949,700 A | 9/1999 | Furukawa et al. | |
| 5,973,403 A | 10/1999 | Wark | |
| 6,086,386 A | 7/2000 | Fjelstad et al. | |
| 6,130,116 A | 10/2000 | Smith et al. | |
| 6,159,837 A | 12/2000 | Yamaji et al. | |
| 6,177,636 B1 | 1/2001 | Fjelstad | |
| 6,197,665 B1 | 3/2001 | DiStefano et al. | |
| 6,252,264 B1 | 6/2001 | Bailey et al. | |
| 6,255,899 B1 | 7/2001 | Bertin et al. | |
| 6,261,867 B1 | 7/2001 | Robichaud et al. | |
| 6,297,960 B1 | 10/2001 | Moden et al. | |
| 6,323,436 B1 | 11/2001 | Hedrick et al. | |
| 6,343,019 B1 | 1/2002 | Jiang et al. | |
| 6,376,769 B1 | 4/2002 | Chung | |
| 6,380,318 B1 | 4/2002 | Saito et al. | |
| 6,384,473 B1 | 5/2002 | Peterson et al. | |
| 6,426,560 B1 | 7/2002 | Kawamura et al. | |
| 6,433,422 B1 | 8/2002 | Yamasaki | |
| 6,445,594 B1 | 9/2002 | Nakagawa et al. | |
| 6,452,266 B1 | 9/2002 | Iwaya et al. | |
| 6,461,895 B1 | 10/2002 | Liang et al. | |
| 6,462,423 B1 | 10/2002 | Akram et al. | |
| 6,521,981 B2 | 2/2003 | Miyazaki et al. | |
| 6,560,134 B2 | 5/2003 | Brox et al. | |
| 6,577,004 B1 | 6/2003 | Rumsey et al. | |
| 6,611,057 B2 | 8/2003 | Mikubo et al. | |
| 6,617,695 B1 | 9/2003 | Kasatani | |
| 6,619,973 B2 | 9/2003 | Perino et al. | |
| 6,620,648 B2 | 9/2003 | Yang | |
| 6,633,078 B2 | 10/2003 | Hamaguchi et al. | |
| 6,658,530 B1 | 12/2003 | Robertson et al. | |
| 6,661,089 B2 | 12/2003 | Huang | |
| 6,692,987 B2 | 2/2004 | Lim et al. | |
| 6,707,141 B2 | 3/2004 | Akram | |
| 6,720,666 B2 | 4/2004 | Lim et al. | |
| 6,742,098 B1 | 5/2004 | Halbert et al. | |
| 6,744,137 B2 | 6/2004 | Kinsman | |
| 6,765,288 B2 | 7/2004 | Damberg | |
| 6,781,220 B2 | 8/2004 | Taube et al. | |
| 6,821,815 B2 | 11/2004 | Smith et al. | |
| 6,836,007 B2 | 12/2004 | Michii et al. | |
| 6,876,088 B2 | 4/2005 | Harvey | |
| 6,894,379 B2 | 5/2005 | Feurle | |
| 6,894,381 B2 | 5/2005 | Hetzel et al. | |
| 6,906,415 B2 | 6/2005 | Jiang et al. | |
| 6,943,057 B1 | 9/2005 | Shim et al. | |
| 6,977,440 B2 | 12/2005 | Pflughaupt et al. | |
| 6,982,485 B1 | 1/2006 | Lee et al. | |
| 7,061,092 B2 | 6/2006 | Akram et al. | |
| 7,061,105 B2 | 6/2006 | Masuda et al. | |
| 7,061,121 B2 | 6/2006 | Haba | |
| 7,091,064 B2 | 8/2006 | Jiang | |
| 7,122,897 B2 | 10/2006 | Aiba et al. | |
| 7,123,497 B2 | 10/2006 | Matsui et al. | |
| 7,138,709 B2 | 11/2006 | Kumamoto | |
| 7,141,879 B2 | 11/2006 | Wakamiya et al. | |
| 7,145,226 B2 | 12/2006 | Kumamoto | |
| 7,151,319 B2 | 12/2006 | Iida et al. | |
| 7,164,149 B2 | 1/2007 | Matsubara | |
| 7,170,158 B2 | 1/2007 | Choi et al. | |
| 7,262,507 B2 | 8/2007 | Hino et al. | |
| 7,272,888 B2 | 9/2007 | DiStefano | |
| 7,294,928 B2 * | 11/2007 | Bang et al. | 257/737 |
| 7,324,352 B2 | 1/2008 | Goodwin | |
| 7,368,319 B2 | 5/2008 | Ha et al. | |
| 7,372,169 B2 | 5/2008 | Chang | |
| 7,389,937 B2 | 6/2008 | Ito | |
| 7,405,471 B2 | 7/2008 | Kledzik et al. | |
| 7,414,312 B2 | 8/2008 | Nguyen et al. | |
| 7,420,284 B2 | 9/2008 | Miyazaki et al. | |
| 7,476,975 B2 | 1/2009 | Ogata | |
| 7,518,226 B2 | 4/2009 | Cablao et al. | |
| 7,535,110 B2 | 5/2009 | Wu et al. | |
| 7,550,842 B2 | 6/2009 | Khandros et al. | |
| 7,589,409 B2 | 9/2009 | Gibson et al. | |
| 7,633,146 B2 | 12/2009 | Masuda et al. | |
| 7,633,147 B2 | 12/2009 | Funaba et al. | |
| 7,642,635 B2 | 1/2010 | Kikuchi et al. | |
| 7,692,931 B2 | 4/2010 | Chong et al. | |
| 7,763,964 B2 | 7/2010 | Matsushima | |
| 7,763,969 B2 | 7/2010 | Zeng et al. | |
| RE41,478 E | 8/2010 | Nakamura et al. | |
| RE41,721 E | 9/2010 | Nakamura et al. | |
| RE41,722 E | 9/2010 | Nakamura et al. | |
| 7,795,721 B2 | 9/2010 | Kurita | |
| RE41,972 E | 11/2010 | Lenander et al. | |
| 7,855,445 B2 * | 12/2010 | Landry et al. | 257/686 |
| 7,989,940 B2 | 8/2011 | Haba et al. | |
| RE42,972 E | 11/2011 | Nakamura et al. | |
| 8,072,037 B2 | 12/2011 | Murphy et al. | |
| 8,138,015 B2 | 3/2012 | Joseph et al. | |
| 8,254,155 B1 | 8/2012 | Crisp et al. | |
| 8,278,764 B1 | 10/2012 | Crisp et al. | |
| 8,338,963 B2 | 12/2012 | Haba et al. | |
| 8,345,441 B1 | 1/2013 | Crisp et al. | |
| 8,378,478 B2 | 2/2013 | Desai et al. | |
| 8,405,207 B1 | 3/2013 | Crisp et al. | |
| 8,436,457 B2 | 5/2013 | Crisp et al. | |
| 8,436,477 B2 | 5/2013 | Crisp et al. | |
| 8,441,111 B2 | 5/2013 | Crisp et al. | |
| 8,502,390 B2 | 8/2013 | Crisp et al. | |
| 8,513,813 B2 | 8/2013 | Crisp et al. | |
| 8,513,817 B2 | 8/2013 | Haba et al. | |
| 8,525,327 B2 | 9/2013 | Crisp et al. | |
| 8,610,260 B2 | 12/2013 | Crisp et al. | |
| 8,629,545 B2 | 1/2014 | Crisp et al. | |
| 8,653,646 B2 | 2/2014 | Crisp et al. | |
| 8,659,139 B2 | 2/2014 | Crisp et al. | |
| 8,659,140 B2 | 2/2014 | Crisp et al. | |
| 8,659,141 B2 | 2/2014 | Crisp et al. | |
| 8,659,142 B2 | 2/2014 | Crisp et al. | |
| 8,659,143 B2 | 2/2014 | Crisp et al. | |
| 8,670,261 B2 | 3/2014 | Crisp et al. | |
| 8,823,165 B2 | 9/2014 | Haba et al. | |
| 8,902,680 B2 | 12/2014 | Yamamoto | |
| 8,917,532 B2 | 12/2014 | Crisp et al. | |
| 2001/0002727 A1 | 6/2001 | Shiraishi et al. | |
| 2001/0013662 A1 | 8/2001 | Kudou et al. | |
| 2001/0022740 A1 | 9/2001 | Nuxoll et al. | |
| 2001/0038106 A1 | 11/2001 | Coteus et al. | |
| 2002/0000583 A1 | 1/2002 | Kitsukawa et al. | |
| 2002/0016056 A1 | 2/2002 | Corisis | |
| 2002/0027019 A1 | 3/2002 | Hashimoto | |
| 2002/0030261 A1 | 3/2002 | Rolda et al. | |
| 2002/0043719 A1 | 4/2002 | Iwaya et al. | |
| 2002/0053727 A1 | 5/2002 | Kimura | |
| 2002/0053732 A1 | 5/2002 | Iwaya et al. | |
| 2002/0066950 A1 | 6/2002 | Joshi | |
| 2002/0105096 A1 | 8/2002 | Hirata et al. | |
| 2002/0130412 A1 | 9/2002 | Nagai et al. | |
| 2002/0171142 A1 | 11/2002 | Kinsman | |
| 2003/0064547 A1 | 4/2003 | Akram et al. | |
| 2003/0089978 A1 | 5/2003 | Miyamoto et al. | |
| 2003/0089982 A1 | 5/2003 | Feurle | |
| 2003/0107118 A1 | 6/2003 | Pflughaupt et al. | |
| 2003/0107908 A1 | 6/2003 | Jang et al. | |
| 2003/0205801 A1 | 11/2003 | Baik et al. | |
| 2003/0211660 A1 | 11/2003 | Lim et al. | |
| 2004/0016999 A1 | 1/2004 | Misumi | |
| 2004/0061211 A1 | 4/2004 | Michii et al. | |
| 2004/0061577 A1 | 4/2004 | Breisch et al. | |

(56) References Cited

U.S. PATENT DOCUMENTS

| | | |
|---|---|---|
| 2004/0090756 A1 | 5/2004 | Ho et al. |
| 2004/0112088 A1 | 6/2004 | Ueda et al. |
| 2004/0145042 A1 | 7/2004 | Morita et al. |
| 2004/0145054 A1 | 7/2004 | Bang et al. |
| 2004/0164382 A1 | 8/2004 | Gerber et al. |
| 2004/0168826 A1 | 9/2004 | Jiang et al. |
| 2004/0184240 A1 | 9/2004 | Su |
| 2004/0201111 A1 | 10/2004 | Thurgood |
| 2005/0116358 A1 | 6/2005 | Haba |
| 2005/0194672 A1 | 9/2005 | Gibson et al. |
| 2005/0206585 A1 | 9/2005 | Stewart et al. |
| 2005/0243590 A1 | 11/2005 | Lee et al. |
| 2005/0258532 A1 | 11/2005 | Yoshikawa et al. |
| 2006/0004981 A1 | 1/2006 | Bains |
| 2006/0081983 A1 | 4/2006 | Humpston et al. |
| 2006/0087013 A1* | 4/2006 | Hsieh ............................ 257/678 |
| 2006/0091518 A1 | 5/2006 | Grafe et al. |
| 2006/0170093 A1 | 8/2006 | Pendse |
| 2006/0207788 A1 | 9/2006 | Yoon et al. |
| 2006/0290005 A1 | 12/2006 | Thomas et al. |
| 2007/0025131 A1 | 2/2007 | Ruckerbauer et al. |
| 2007/0108592 A1 | 5/2007 | Lai et al. |
| 2007/0120245 A1 | 5/2007 | Yoshikawa et al. |
| 2007/0143553 A1 | 6/2007 | LaBerge |
| 2007/0187836 A1 | 8/2007 | Lyne |
| 2007/0241441 A1 | 10/2007 | Choi et al. |
| 2007/0260841 A1 | 11/2007 | Hampel et al. |
| 2008/0012110 A1 | 1/2008 | Chong et al. |
| 2008/0052462 A1 | 2/2008 | Blakely et al. |
| 2008/0061423 A1 | 3/2008 | Brox et al. |
| 2008/0088033 A1 | 4/2008 | Humpston et al. |
| 2008/0098277 A1 | 4/2008 | Hazelzet |
| 2008/0150155 A1 | 6/2008 | Periaman et al. |
| 2008/0182443 A1 | 7/2008 | Beaman et al. |
| 2008/0185705 A1 | 8/2008 | Osborn et al. |
| 2008/0191338 A1 | 8/2008 | Park et al. |
| 2008/0230888 A1 | 9/2008 | Sasaki |
| 2008/0256281 A1 | 10/2008 | Fahr et al. |
| 2008/0265397 A1 | 10/2008 | Lin et al. |
| 2009/0001574 A1 | 1/2009 | Fang et al. |
| 2009/0065948 A1 | 3/2009 | Wang |
| 2009/0108425 A1 | 4/2009 | Lee et al. |
| 2009/0140442 A1 | 6/2009 | Lin |
| 2009/0200680 A1 | 8/2009 | Shinohara et al. |
| 2009/0250255 A1 | 10/2009 | Shilling et al. |
| 2009/0250822 A1 | 10/2009 | Chen et al. |
| 2009/0294938 A1 | 12/2009 | Chen |
| 2009/0314538 A1 | 12/2009 | Jomaa et al. |
| 2010/0052111 A1 | 3/2010 | Urakawa |
| 2010/0102428 A1 | 4/2010 | Lee et al. |
| 2010/0182040 A1 | 7/2010 | Feng et al. |
| 2010/0244272 A1 | 9/2010 | Lee et al. |
| 2010/0244278 A1 | 9/2010 | Shen |
| 2010/0295166 A1 | 11/2010 | Kim |
| 2010/0301466 A1 | 12/2010 | Taoka et al. |
| 2010/0327457 A1 | 12/2010 | Mabuchi |
| 2011/0042824 A1 | 2/2011 | Koide |
| 2011/0084758 A1 | 4/2011 | Shibata et al. |
| 2011/0110165 A1 | 5/2011 | Gillingham et al. |
| 2011/0140247 A1 | 6/2011 | Pagaila et al. |
| 2011/0193178 A1 | 8/2011 | Chang et al. |
| 2011/0193226 A1 | 8/2011 | Kirby et al. |
| 2011/0254156 A1 | 10/2011 | Lin |
| 2012/0018863 A1 | 1/2012 | Oganesian et al. |
| 2012/0020026 A1 | 1/2012 | Oganesian et al. |
| 2012/0153435 A1 | 6/2012 | Haba et al. |
| 2012/0155049 A1 | 6/2012 | Haba et al. |
| 2012/0206181 A1 | 8/2012 | Lin et al. |
| 2012/0217645 A1 | 8/2012 | Pagaila |
| 2012/0313239 A1 | 12/2012 | Zohni |
| 2012/0313253 A1 | 12/2012 | Nakadaira et al. |
| 2013/0009308 A1 | 1/2013 | Kwon |
| 2013/0009318 A1 | 1/2013 | Chia et al. |
| 2013/0015590 A1 | 1/2013 | Haba et al. |
| 2013/0082394 A1 | 4/2013 | Crisp et al. |
| 2013/0083583 A1 | 4/2013 | Crisp et al. |
| 2013/0168843 A1 | 7/2013 | Zohni |
| 2013/0286707 A1 | 10/2013 | Crisp et al. |
| 2013/0307138 A1 | 11/2013 | Crisp et al. |
| 2014/0042644 A1 | 2/2014 | Haba et al. |
| 2014/0055941 A1 | 2/2014 | Crisp et al. |
| 2014/0055942 A1 | 2/2014 | Crisp et al. |
| 2014/0055970 A1 | 2/2014 | Crisp et al. |

FOREIGN PATENT DOCUMENTS

| | | |
|---|---|---|
| JP | 2002-076252 A | 3/2002 |
| JP | 2004-063767 A | 2/2004 |
| JP | 2008-198841 A | 8/2008 |
| JP | 3143893 U | 8/2008 |
| JP | 2010-098098 A | 4/2010 |
| KR | 2001-0002214 A | 1/2001 |
| KR | 2005-0119414 A | 12/2005 |
| KR | 2006-0120365 A | 11/2006 |
| KR | 2007-0088177 A | 8/2007 |
| KR | 2009-0008341 A | 1/2009 |
| KR | 2009-0086314 A | 8/2009 |
| TW | 312044 | 8/1997 |
| TW | 428258 | 4/2001 |
| TW | 429561 | 4/2001 |
| TW | 478137 B | 3/2002 |
| TW | 567593 B | 12/2003 |
| TW | M338433 U | 8/2008 |
| TW | 200842998 A | 11/2008 |
| TW | 200901194 A | 1/2009 |
| TW | 200926312 A | 6/2009 |
| TW | M363079 U | 8/2009 |
| TW | M398313 | 2/2011 |
| TW | 201115659 A | 5/2011 |
| TW | 201208004 | 2/2012 |
| TW | M426922 U | 4/2012 |
| TW | 201222684 | 6/2012 |
| TW | 201234556 A | 8/2012 |
| WO | 2010120310 A1 | 10/2010 |

OTHER PUBLICATIONS

International Search Report and Written Opinion for Application No. PCT/US2013/056777 dated Jan. 21, 2015.
Taiwanese Office Action for Application No. 101136585 dated Jan. 21, 2015.
U.S. Appl. No. 13/439,273, filed Apr. 4, 2012.
U.S. Appl. No. 13/439,299, filed Apr. 4, 2012.
U.S. Appl. No. 13/439,354, filed Apr. 4, 2012.
U.S. Appl. No. 13/440,199, filed Apr. 5, 2012.
U.S. Appl. No. 13/440,280, filed Apr. 5, 2012.
U.S. Appl. No. 13/440,290, filed Apr. 5, 2012.
U.S. Appl. No. 13/440,299, filed Apr. 5, 2012.
U.S. Appl. No. 13/440,515, filed Apr. 5, 2012.
U.S. Appl. No. 13/839,402, filed Mar. 15, 2013.
U.S. Appl. No. 13/840,353, filed Mar. 15, 2013.
U.S. Appl. No. 13/840,542, filed Mar. 15, 2013.
U.S. Appl. No. 13/841,052, filed Mar. 15, 2013.
U.S. Appl. No. 13/306,068, filed Nov. 29, 2011.
U.S. Appl. No. 13/346,201, filed Jan. 9, 2012.
U.S. Appl. No. 13/354,747, filed Jan. 20, 2012.
U.S. Appl. No. 13/354,772, filed Jan. 20, 2012.
U.S. Appl. No. 13/439,286, filed Apr. 5, 2012.
U.S. Appl. No. 13/439,317, filed Apr. 5, 2012.
U.S. Appl. No. 13/440,212, filed Apr. 5, 2012.
U.S. Appl. No. 13/440,313, filed Apr. 5, 2012.
US Non Final Office Action dated Oct. 18, 2012 U.S. Appl. No. 13/439,299.
US Non-Final Office Action for Application U.S. Appl. No. 13/440,199 dated Aug. 31, 2012.
US Non-Final Office Action for U.S. Appl. No. 13/440,280 dated Aug. 31, 2012.
Taiwanese Office Action for Application No. 101136595 dated Oct. 27, 2014.
International Search Report and Written Opinion for Application No. PCT/US2014/041709 dated Nov. 4, 2014.

(56) References Cited

OTHER PUBLICATIONS

Taiwanese Office Action for Application No. 101136575 dated Oct. 28, 2014.
Elpida User's Manual, "Introduction to GDDR5 SGRAM", Document No. E1600E10 (Ver 1.0), Published Mar. 2010, Japan, URL: http:'www.elpida.com.
Hynix, "2GB (64Mx32) GDDR5 SGRAM HRGQ2H24AFR", Nov. 2011-Feb. 2012.
International Search Report and Written Opinion dated Mar. 21, 2013 for Application No. PCT/US2012/000425.
International Search Report and Written Opinion dated Mar. 21, 2013 for Application No. PCT/US2012/057911.
International Search Report and Written Opinion for Application No. PCT/US2012/046049 dated Jan. 10, 2013.
International Search Report and Written Opinion for Application No. PCT/US2012/046049 dated Nov. 29, 2012.
International Search Report and Written Opinion for Application No. PCT/US2012/046249 dated Mar. 20, 2013.
International Search Report and Written Opinion for Application No. PCT/US2012/046255 dated Mar. 20, 2013.
International Search Report and Written Opinion for Application No. PCT/US2012/057170 dated Mar. 22, 2013.
International Search Report and Written Opinion for Application No. PCT/US2012/057179 dated Apr. 4, 2013.
International Search Report and Written Opinion for Application No. PCT/US2012/057200 dated Mar. 1, 2013.
International Search Report and Written Opinion for Application No. PCT/US2012/057204 dated Aug. 30, 2013.
International Search Report and Written Opinion for Application No. PCT/US2012/057554 dated Feb. 28, 2013.
International Search Report and Written Opinion for Application No. PCT/US2012/057563 dated Mar. 5, 2013.
International Search Report and Written Opinion for Application No. PCT/US2012/057810 dated Jul. 23, 2013.
International Search Report and Written Opinion for Application No. PCT/US2012/058273 dated Mar. 6, 2013.
International Search Report and Written Opinion for Application No. PCT/US2012/058398 dated Jul. 4, 2013.
International Search Report and Written Opinion for Application No. PCT/US2012/058407 dated Mar. 28, 2013.
International Search Report and Written Opinion for Application No. PCT/US2012/058423 dated Mar. 20, 2013.
International Search Report and Written Opinion for Application No. PCT/US2012/058434 dated Jun. 21, 2013.
International Search Report and Written Opinion for Application No. PCT/US2012/058557 dated Mar. 12, 2013.
International Search Report and Written Opinion for Application No. PCT/US2013/056773 dated Dec. 4, 2013.
International Search Report and Written Opinion for Application No. PCT/US2012/057895 dated Jun. 10, 2013.
International Search Report and Written Opinion for Application No. PCT/US2012/058229 dated Jul. 3, 2013.
International Search Report and Written Opinion for Application PCT/US2013/056777 dated Jan. 2, 2014.
International Search Report for Application No. PCT/US2012/057173 dated Aug. 5, 2013.
International Search Report for Application No. PCT/US2012/057905 dated Aug. 20, 2013.
Kang, et al., 8Gb 3D DDR3 DRAM Using Through-Silicon-Via Technology, IEEE, International Solid-State Circuits Conference, 2009, pp. 130-132.
Kang, et al., 8Gb 3D DDR3 DRAM Using Through-Silicon-Via Technology, IEEE, International Solid-State Circuits Conference, 2009, Samsung Electronics, Hwasung, Korea.
Office Action from Taiwan for Application No. 101125197 dated May 19, 2014.
Partial International Search Report dated Oct. 12, 2012 in International Patent Appl. No. PCT/US2012/046249.
Partial International Search Report dated Oct. 12, 2012 in International Patent Appl. No. PCT/US2012/046255.
Partial International Search Report dated Oct. 26, 2012 in International Patent Appl. No. PCT/US2012/046049.
Partial Search Report for Application No. PCT/US2012/000425 dated Jan. 30, 2013.
Partial Search Report for Application No. PCT/US2012/057170 dated Jan. 31, 2013.
Partial Search Report for Application No. PCT/US2012/057554 dated Jan. 24, 2013.
Partial Search Report for Application No. PCT/US2012/058273 dated Jan. 24, 2013.
Partial Search Report for Application No. PCT/US2012/058557 dated Feb. 4, 2013.
Sandforce, "SF-2200 & SF-2100 Client SSD Processors", 2011.
Taiwanese Allowance and Search Report for Application No. 101136592 dated Jun. 27, 2014.
U.S. Appl. No. 61/477,877, filed Apr. 21, 2011.
US Amendment for U.S. Appl. No. 13/439,299 dated Jan. 18, 2013.
US Amendment for U.S. Appl. No. 13/440,199 dated Nov. 30, 2012.
US Amendment for U.S. Appl. No. 13/440,280 dated Nov. 30, 2012.
U.S. Appl. No. 13/080,876, filed Apr. 6, 2011.
U.S. Appl. No. 13/306,300, filed on Nov. 29, 2011.
U.S. Appl. No. 13/337,565, filed Dec. 27, 2011.
U.S. Appl. No. 13/337,575, filed Dec. 27, 2011.
U.S. Appl. No. 13/346,185, filed Jan. 9, 2012.
U.S. Appl. No. 13/439,228, filed Apr. 4, 2012.
Taiwanese Notice of Allowance for Application No. 102130518 dated Mar. 31, 2015.
Taiwanese Office Action for Application No. 101125193 dated Aug. 4, 2015.
Taiwanese Office Action for Application No. 101136577 dated May 12, 2015.
Taiwanese Office Action for Application No. 101136578 dated May 12, 2015.
Taiwanese Office Action for Application No. 101136606 dated Mar. 27, 2015.
Taiwanese Office Action for Application No. 102130519 dated May 7, 2015.
Written Opinion of the International Preliminary Examining Authority for Application No. PCT/US2014/041709 dated Jun. 1, 2015.
International Search Report and Written Opinion for Application No. PCT/US2015/042726 dated Nov. 12, 2015.

\* cited by examiner

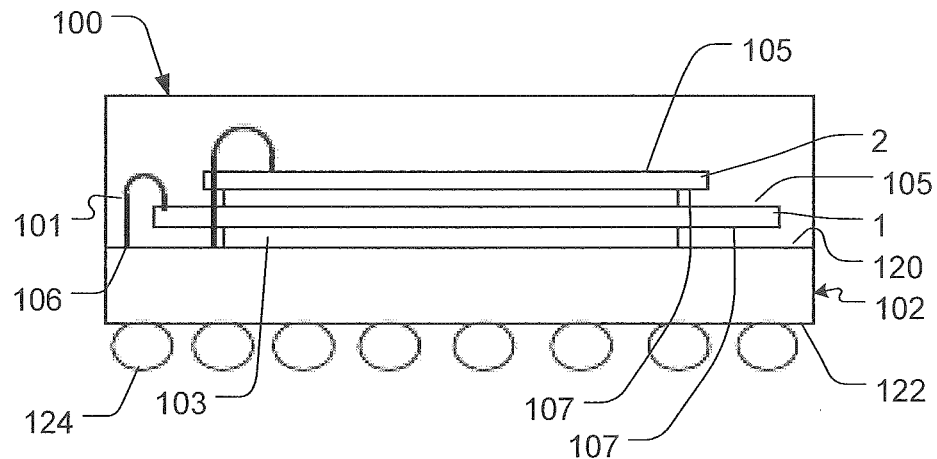
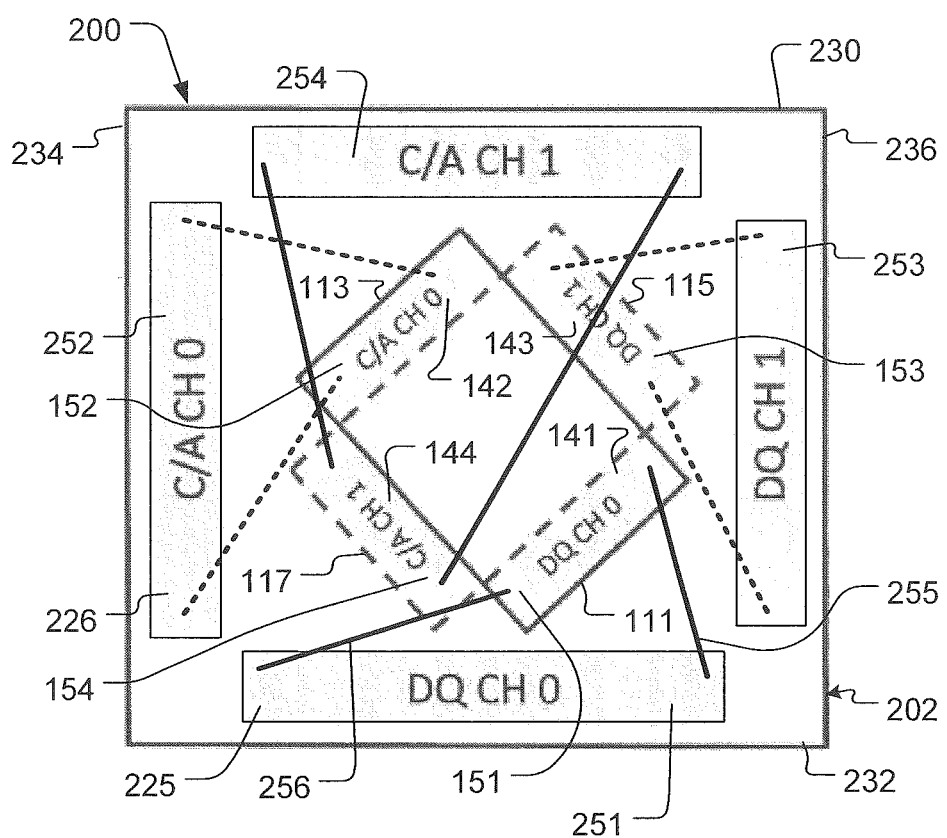

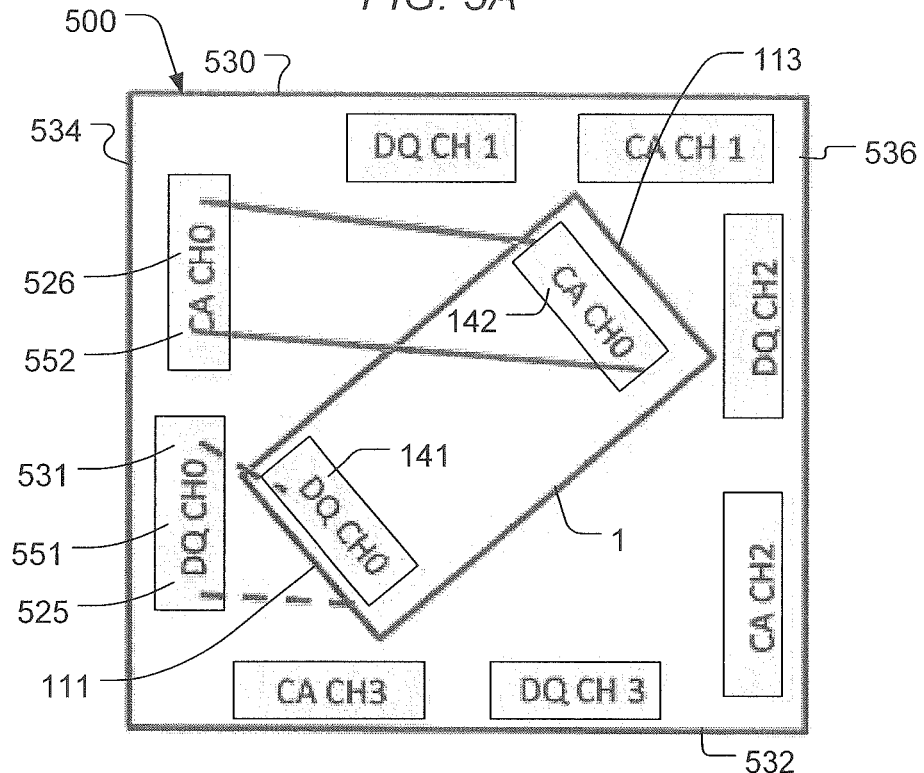
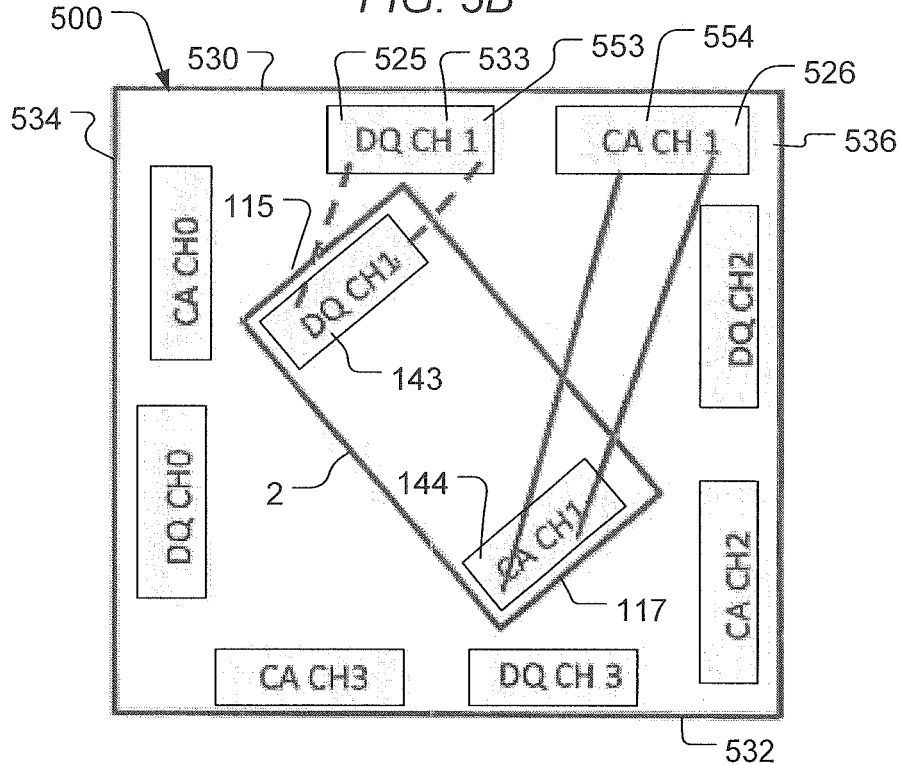

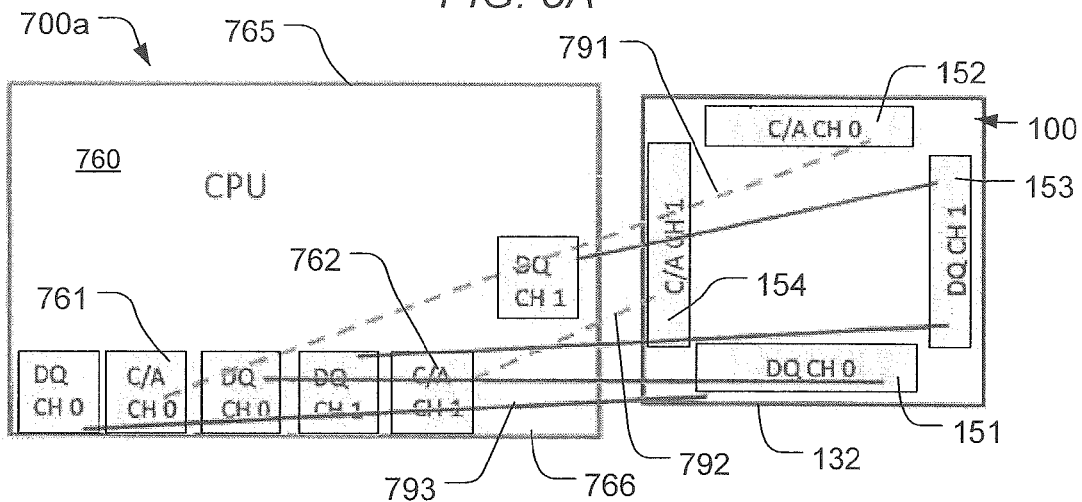

DIE STACKING TECHNIQUES IN BGA MEMORY PACKAGE FOR SMALL FOOTPRINT CPU AND MEMORY MOTHERBOARD DESIGN

BACKGROUND OF THE INVENTION

The subject matter of the present application relates to microelectronic packaging, and more specifically to multi-chip microelectronic memory packages, such as those that include multiple dynamic random access memory ("DRAM") chips in the same package.

Microelectronic elements generally comprise a thin slab of a semiconductor material, such as silicon or gallium arsenide, commonly called a die or a semiconductor chip. Semiconductor chips are commonly provided as individual, packaged units in form of microelectronic packages. In some designs, the semiconductor chip is mounted to a substrate or chip carrier, which is in turn mounted on a circuit panel, such as a printed circuit board.

The active circuitry is fabricated in a first face of the semiconductor chip (e.g., a front face or surface). To facilitate electrical connection to the active circuitry, the chip is provided with bond pads on the same face. The bond pads are typically placed in a regular array either around the edges of the die or, for many memory chips, in the die center. The bond pads are generally made of a conductive metal, such as copper, or aluminum, around 0.5 micron (μm) thick. The bond pads could include a single layer or multiple layers of metal. The size of the bond pads will vary with the specific type of chip but will typically measure tens to hundreds of microns on a side.

Size is a significant consideration in any physical arrangement of chips. The demand for more compact physical arrangements of chips has become even more intense with the rapid progress of portable electronic devices. Merely by way of example, devices commonly referred to as "smart phones" and "tablet computers" integrate the functions of a cellular telephone with powerful data processors, memory and ancillary devices such as global positioning system receivers, electronic cameras, and local area network connections along with high-resolution displays and associated image processing chips. Such devices can provide capabilities such as full internet connectivity, entertainment including full-resolution video, navigation, electronic banking and more, all in a pocket-size device. Complex portable devices require packing numerous chips into a small space. Moreover, some of the chips have many input and output connections, commonly referred to as "I/Os." These I/Os must be interconnected with the I/Os of other chips. The components which form the interconnections should not greatly increase the size of the assembly. Similar needs arise in other applications as, for example, in data servers such as those used in internet search engines. For example, structures which provide numerous short, interconnects between complex chips can increase the bandwidth of the search engine and reduce its power consumption.

In view of the foregoing, it can be advantageous to assemble multiple chips, particularly memory chips such as DRAMs in multi-chip memory packages. Further improvements can be made to the structure and function of multi-chip memory packages.

BRIEF SUMMARY OF THE INVENTION

In accordance with an aspect of the invention, a microelectronic package can include a substrate comprising a dielectric element having first and second opposite surfaces, and a microelectronic element having a face extending parallel to the first surface. The substrate can also include a plurality of peripheral edges extending between the first and second surfaces defining a generally rectangular or square periphery of the substrate. The substrate can further include a plurality of contacts and terminals, the contacts being at the first surface, the terminals being at at least one of the first or second surfaces. The microelectronic elements can have a plurality of edges bounding the face, and a plurality of element contacts at the face electrically coupled with the terminals through the contacts of the substrate. Each edge of the microelectronic element can be oriented at an oblique angle with respect to the peripheral edges of the substrate.

A microelectronic assembly can include the microelectronic package as described above, a processor, and a circuit panel having panel contacts. The terminals of the microelectronic package can be bonded to the panel contacts. The processor can be electrically coupled to the microelectronic package through conductive elements of the circuit panel. A system can include the microelectronic package as described above and one or more other electronic components electrically connected to the microelectronic package. The system can also include a housing, the microelectronic package and the other electronic components being mounted to the housing.

BRIEF DESCRIPTION OF THE DRAWINGS

FIG. 1C is an enlarged side elevational view of the microelectronic package of FIGS. 1A and 1B shown with some of the wire bonds omitted, taken from the east edge of the package.

FIG. 2A is a diagrammatic top plan view of a microelectronic package according to another embodiment of the present invention.

FIG. 3A is a diagrammatic top plan view of a microelectronic package having four microelectronic elements, according to another embodiment of the present invention, showing some of the signal connections to the first microelectronic element.

FIG. 3B is a diagrammatic top plan view of the microelectronic package of FIG. 3A, showing some of the signal connections to the second microelectronic element.

FIG. 5A is a schematic diagram illustrating another possible interconnection arrangement of the microelectronic package of FIGS. 1A-1C in a system and its interconnections with a processor.

FIG. 5B is a schematic diagram illustrating a possible interconnection arrangement of the microelectronic package of FIG. 2B in a system and its interconnections with a processor.

FIG. 6 is a diagrammatic top plan view of a microelectronic element that can be included in the microelectronic package of FIGS. 1A-3E.

DETAILED DESCRIPTION

With reference to the various Figures as further described herein, a variety of multi-chip microelectronic package configurations are provided that can each have a common package terminal bailout on a surface of the package for interconnection of terminals to a common interface on a circuit panel or other component of a system. In such way, the common interface on the circuit panel or other component can be standardized for connection to all such microelectronic packages, even though the particular microelectronic package may vary significantly from another such microelectronic package in the number of semiconductor memory chips (hereinafter, "chips") therein, the particular type of chip, and the particular standard by which input signals are provided thereto, e.g., address information, or command address bus signals, as well as number of ranks of memory supported by the package.

Certain embodiments of the invention provide a package or microelectronic assembly in which a microelectronic element, e.g., a semiconductor chip, or stacked arrangement of semiconductor chips, is configured to predominantly provide a memory storage array function. In such microelectronic element, the number of active devices, e.g., transistors, therein that are configured, i.e., constructed and interconnected with other devices, to provide memory storage array function, is greater than the number of active devices that are configured to provide any other function. Thus, in one example, a microelectronic element such as a DRAM chip may have memory storage array function as its primary or sole function.

Alternatively, in another example, such microelectronic element may have mixed use and may incorporate active devices configured to provide memory storage array function, and may also incorporate other active devices configured to provide another function such as processor function, or signal processor or graphics processor function, among others. In this case, the microelectronic element may still have a greater number of active devices configured to provide the memory storage array function than any other function of the microelectronic element.

Figure 1A:
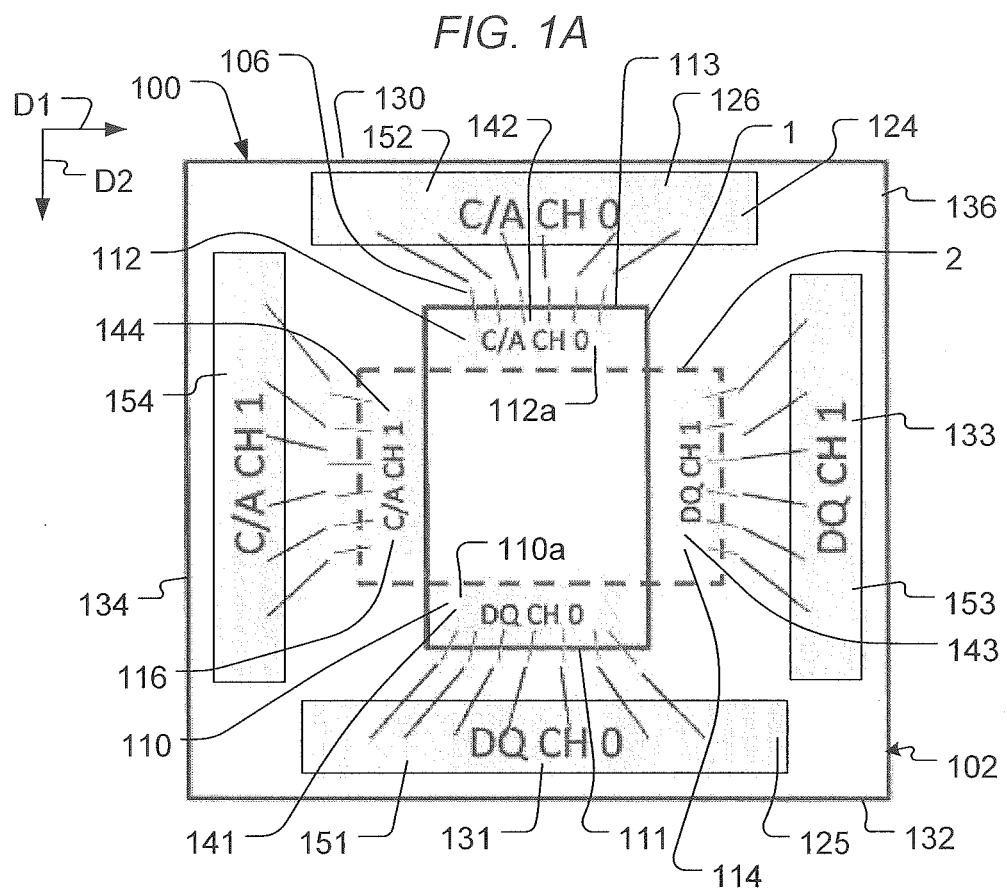
FIGS. 1A and 1B are diagrammatic top plan views of a microelectronic package according to an embodiment of the present invention.
Figure 1B:
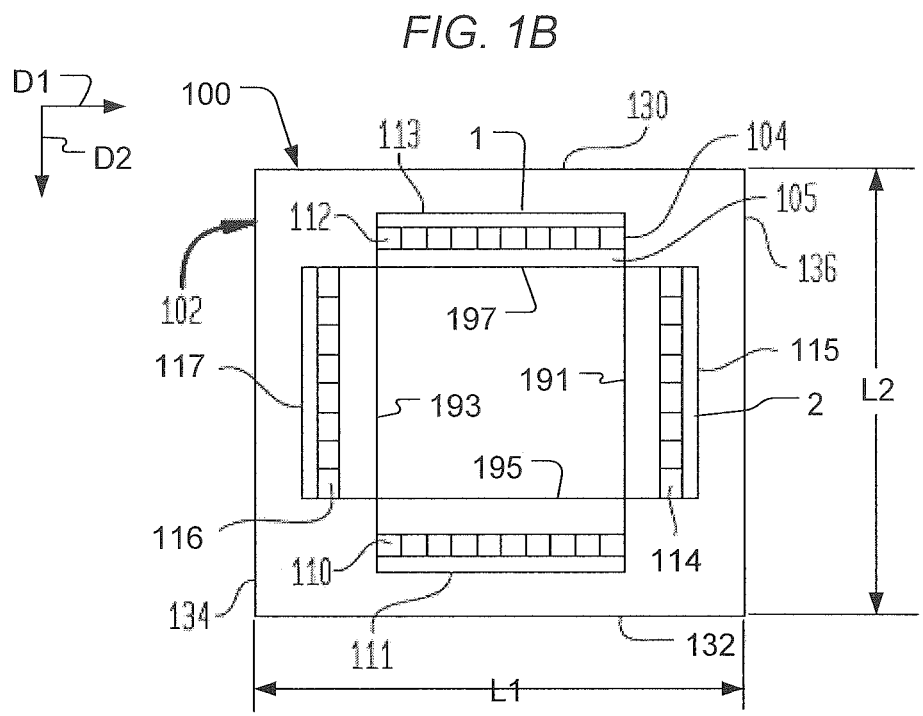

FIGS. 1A-1C illustrate an example implementation of a microelectronic package 100 according to an embodiment herein. As seen therein, a first microelectronic element 1 and a second microelectronic element 2 are stacked face up above a substrate 102 such as a supporting dielectric element, e.g., a tape used in tape automated bonding ("TAB"). In one example, the substrate 102 can consist essentially of a dielectric element having a coefficient of thermal expansion in a plane of the substrate of less than 10 parts per million per degree Centigrade in a plane of the substrate ("ppm/° C."). In a particular embodiment, the substrate 102 can consist essentially of a dielectric element having a coefficient of thermal expansion in a plane of the substrate of between about 10 and about 20 ppm/° C. in a plane of the substrate.

The dielectric element of the substrate 102 can have first and second opposite surfaces 120, 122 and a plurality of peripheral edges 130, 132, 134, 136 extending between the first and second surfaces and defining a generally rectangular or square periphery of the substrate.

The substrate 102 can have oppositely-facing north and south peripheral edges 130, 132 adjacent to oppositely-facing east and west peripheral edges 136, 134 each extending between the north and south peripheral edges. As used herein, the directions north, south, east and west are merely used for convenience in describing the orientations and directions in the frame of reference of a particular microelectronic package and do not correspond to geographic directions.

Each surface 120, 122 of the substrate 102 can have first and second dimensions in orthogonal directions D1, D2. For example, each surface 120, 122 can have a first dimension L1 extending between the west and east peripheral edges 134, 136 in a first direction D1, and each surface can have a second dimension L2 extending between the north and south peripheral edges 130, 132 in a second direction D2 orthogonal to the first direction.

Each microelectronic element 1, 2 can have a front face 105 extending parallel to the first surface 120 of the substrate 102, a plurality of edges bounding the front face, and a plurality of element contacts 104 at the front face electrically coupled with terminals 124 of the substrate through contacts 106 of the substrate. The first and second microelectronic elements 1, 2 can be arranged in a stack on the same side of the substrate 102.

As shown in FIGS. 1A-1C, element contacts 104 at a front face 105 of each of the microelectronic elements 1 and 2 are wire bonded to corresponding substrate contacts 106 at a first surface 120 of the substrate 102. The wire bonds 101 can extend above the front face 105 of each of the microelectronic elements 1 and 2, the wire bonds being electrically coupled to the element contacts 104 of each of the microelectronic elements and the substrate contacts 106.

The first microelectronic element 1 can have first and second opposite edges 111, 113 of the front face 105, and third and fourth opposite edges 191, 193 of the front face each extending between the first and second edges. The second microelectronic element 2 can have first and second opposite edges 115, 117 of the front face 105, and third and fourth opposite edges 195, 197 of the front face each extending between the first and second edges.

The microelectronic elements 1 and 2 are placed in the stack in a configuration such that a rear face 107 of the first microelectronic element 1 opposite the front face 105 thereof can be disposed adjacent the first surface 120 of the substrate 102. The rear face 107 of the second microelectronic element 2 can overlie the front face 105 of the first microelectronic element 1.

The configuration of the stack of the microelectronic elements 1 and 2 can be such that the second microelectronic element appears to be rotated 90 degrees in its horizontal plane relative to the first microelectronic element. As shown in FIG. 1A, each of the first and second edges 115, 117 of the second microelectronic element 2 are oriented at a perpendicular angle relative to the first and second edges 111, 113 of the first microelectronic element 1, respectively. As used herein, edges of a microelectronic element that are oriented at a "perpendicular" angle to edges of another microelectronic element means that the edges are perpendicular to one another within a typical manufacturing tolerance known to one skilled in the relevant art.

In a particular embodiment, each of the first and second edges 115, 117 of the second microelectronic element 2 can be oriented at an angle between 60 degrees and 120 degrees relative to the first and second edges 111, 113 of the first microelectronic element 1, respectively.

The first and second microelectronic elements 1, 2 can be arranged in the stack such that the first edge 111 of the first microelectronic element 1 extends beyond the third edge 195 of the second microelectronic element 2 and the second edge 113 of the first microelectronic element extends beyond the fourth edge 197 of the second microelectronic element. Also, the first edge 115 of the second microelectronic element 2 can extend beyond the third edge 191 of the first microelectronic element 1 and the second edge 117 of the second microelectronic element can extend beyond the fourth edge 193 of the first microelectronic element.

As can be seen in FIG. 1C, one or more adhesive layers 103 can be disposed between the rear face 107 of the first microelectronic element 1 and the first surface 120 of the substrate 102, and one or more adhesive layers can be disposed between confronting faces of the first and second microelectronic elements.

The first microelectronic element 1 can be electrically coupled with the substrate contacts 106 through element contacts 104 in at least first and second rows 110 and 112. The first and second rows 110, 112 of element contacts 104 of the first microelectronic element 1 can extend along the front face 105 of the microelectronic element adjacent and parallel to first and second opposite edges 111, 113 of the front face, respectively. The first and second edges 111, 113 of the front face 105 of the first microelectronic element 1 can be oriented towards the south and north edges 132, 130 of the substrate 102, respectively. As used herein, an element contact being "adjacent" to an edge of a microelectronic element means that the element contact is disposed within a distance of no more than one-third of a distance between the first and second edges of the microelectronic element.

The first and second rows 110, 112 of element contacts 104 of the first microelectronic elements 1 can be wire bonded to corresponding ones of the substrate contacts 106 at the first surface 120 of the substrate 102 that lie between the south and north peripheral edges 132, 130 of the substrate and the corresponding edges 111, 113 of the front face 105 of the first microelectronic element 1.

Each of the microelectronic elements 1 and 2 can have a memory storage array. The first row 110 of element contacts 104 of the first microelectronic element 1 can be first contacts 141 configured to carry all of the data information usable by circuitry within the first microelectronic element, the data information including data signals. The second row 112 of element contacts 104 of the first microelectronic element 1 can be second contacts 142 configured to carry information other than the data information that is carried by the first contacts 141.

In one example, the second contacts 142 can be configured to carry all of the address information usable by circuitry within the first microelectronic element 1 to determine an addressable memory location from among all the available addressable memory locations of a memory storage array within the first microelectronic element. In a particular embodiment, one or more of the second contacts 142 can be configured to carry address information and information that controls an operating mode of the first microelectronic element 1.

More specifically, the second contacts 142 can be configured to carry all of a particular set of command signals and control signals transferred to the first microelectronic element 1 from an external component, wherein the command signals include row address strobe (RAS), column address strobe (CAS) and write enable (WE), and wherein the control signals include chip select (CS), clock enable (CKE), and on die termination (ODT). The clock signals can be clocks used by the first microelectronic element 1 for sampling address signals.

In one example, the first contacts 141 can be at positions of at least one row 110 of contacts 104 adjacent to and parallel to the first edge 111 of first microelectronic element 1, and the second contacts 142 can be at positions of at least one row 112 of contacts 104 adjacent to and parallel to the second edge 113 of the first microelectronic element.

As used herein, a "first contact" is a contact for transferring data at least one of: to or from an addressable storage location of a memory storage array provided in a microelectronic element. As used herein, a "second contact" is a contact for transferring at least one of: address information to a microelectronic element to specify an addressable storage location of a memory storage array provided in the microelectronic element, command information (i.e., row address strobe (RAS), column address strobe (CAS) and write enable (WE)), or control information (i.e., chip select (CS), clock enable (CKE), and on die termination (ODT)).

As shown in FIG. 1A, all of the first contacts 141 can be disposed at positions within a first connection region 110a adjacent to the first edge 111 of the first microelectronic element 1, and all of the second contacts 142 can be disposed at positions within a second connection region 112a adjacent to the second edge 113 of the first microelectronic element.

The second microelectronic element 2 can be electrically coupled with the substrate contacts 106 through element contacts 104 in at least first and second rows 114 and 116. The first and second rows 114, 116 of element contacts 104 of the second microelectronic element 2 can extend along the front face 105 of the second microelectronic element adjacent and parallel to first and second opposite edges 115, 117 of the front face, respectively. The first and second edges 115, 117 of the front face 105 of the second microelectronic element 2 can be oriented towards the east and west edges 136, 134 of the substrate 102, respectively.

The first and second rows 114, 116 of element contacts 104 of the second microelectronic element 2 can be wire bonded to corresponding ones of the substrate contacts 106 at the first surface 120 of the substrate 102 that lie between the east and west peripheral edges 136, 134 of the substrate and the corresponding edges 115, 117 of the front face 105 of the second microelectronic element 2.

The first row 114 of element contacts 104 of the second microelectronic element 2 can be first contacts 143 configured to carry all of the data information usable by circuitry within the second microelectronic element, the data information including data signals. The second row 116 of element contacts 104 of the second microelectronic element 2 can be second contacts 144 configured to carry information other than the data information that is carried by the first contacts 143.

In one example, the second contacts 144 can be configured to carry all of the address information usable by circuitry within the second microelectronic element 2 to determine an addressable memory location from among all the available addressable memory locations of a memory storage array within the second microelectronic element. In a particular embodiment, one or more of the second contacts 144 can be configured to carry address information and information that controls an operating mode of the second microelectronic element 2.

More specifically, the second contacts 144 can be configured to carry all of a particular set of command signals and control signals transferred to the second microelectronic element 2 from an external component, wherein the command signals include row address strobe (RAS), column address strobe (CAS) and write enable (WE), and wherein the control signals include chip select (CS), clock enable (CKE), and on die termination (ODT). The clock signals can be clocks used by the second microelectronic element 2 for sampling address signals.

In one example, the first contacts 143 can be at positions of at least one row 114 of contacts 104 adjacent to and parallel to the first edge 115 of second microelectronic element 2, and the second contacts 144 can be at positions of at least one row 118 of contacts 104 adjacent to and parallel to the second edge 117 of the second microelectronic element.

As shown in FIG. 1A, all of the first contacts 143 can be disposed at positions within a first connection region 114a adjacent to the first edge 115 of the second microelectronic element 2, and all of the second contacts 144 can be disposed at positions within a second connection region 116a adjacent to the second edge 117 of the second microelectronic element.

The microelectronic package 100 can have terminals 124 at at least one of the first or second surfaces 120, 122 of the substrate 102 electrically coupled with the first and second microelectronic elements 1, 2 via the substrate contacts 106. The terminals 124 can include first terminals 125 configured to carry all of the data information usable by circuitry within the within the microelectronic package 100, the data information including data signals. The terminals 124 can also include second terminals 126 configured to carry information other than the data information that is carried by the first terminals 125.

In one example, the second terminals 126 can configured to carry all of the address information usable by circuitry within the microelectronic package 100 to determine an addressable memory location from among all the available addressable memory locations of the memory storage arrays of the first and second microelectronic elements 1, 2. In a particular embodiment, one or more of the second terminals 126 can be configured to carry address information and information that controls an operating mode of at least one of the first microelectronic element 1 and the second microelectronic element 2.

More specifically, the second terminals 126 can be configured to carry all of a particular set of command signals and control signals transferred to the microelectronic package 100 from an external component, wherein the command signals include row address strobe (RAS), column address strobe (CAS) and write enable (WE), and wherein the control signals include chip select (CS), clock enable (CKE), and on die termination (ODT). The clock signals can be clocks used by at least one of the first microelectronic element 1 and the second microelectronic element 2 for sampling address signals.

Referring to FIG. 1A, data signals to and from the microelectronic package 100 can be carried, for example, by DQ signals and data strobe signals DQS corresponding to the respective memory channels. For example, a first subset 151 of first terminals 125 electrically coupled to the first microelectronic element 1 and carrying all of the DQ signals and DQ strobe signals for a first memory channel 131 ("DQ CH 0" in FIG. 1A) can be provided adjacent to the south peripheral edge 132 of the substrate 102, and a second subset 153 of first terminals electrically coupled to the second microelectronic element 2 and carrying all of the DQ signals and DQ strobe signals for a second memory channel 133 ("DQ CH 1" in FIG. 1A) can be provided adjacent to the east peripheral edge 136 of the substrate. As used herein, a terminal being "adjacent" to a peripheral edge of the substrate means that the terminal is disposed within a distance of no more than one-half of a distance from the peripheral edge to the opposite peripheral edge. The first and second memory channels 131 and 133 can be configured to be operated independently from one another.

In one example, all of the first terminals 125 of the microelectronic package 100 can be exposed adjacent to south and east peripheral edges 132, 136 of the substrate 102, such that the first terminals can be configured to carry all data signals to and from the microelectronic package.

As further seen in FIG. 1A, in the exemplary terminal bailout of terminals 124, address information, i.e., information that is sufficient to specify an addressable memory location of a memory storage array within each microelectronic element, is disposed in second terminals 126 adjacent to the north and west peripheral edges 130, 134 of the substrate 102. In one example, the exemplary terminal bailout of terminals 124 can be arranged in an area array arranged in rows and columns at at least one of the first or second surfaces 120, 122 of the substrate 102.

Such address information, which may be grouped together with command information such as write enable, column address strobe and row address strobe, and with control information such as a clock used to sample the address information, chip select, and on die termination, collectively, "command address information", can be received on second terminals 126 seen in FIG. 1A that appear, for example, in a first subset 152 of second terminals for a first memory channel 131 ("C/A CH 0" in FIG. 1A) adjacent the north peripheral edge 130 of the substrate 102, and that appear, for example, in a second subset 154 of second terminals for a second memory channel 133 ("C/A CH 1" in FIG. 1A) adjacent the west peripheral edge 134 of the substrate. As seen in FIG. 1A, all of such address information can be input to the package at second terminals 126 that are disposed adjacent to north and west peripheral edges 130, 134 of the substrate 102.

In one example, the second terminals 126 can be configured to carry all of the address information usable by circuitry within the microelectronic package 100 to determine an addressable memory location from among all the available addressable memory locations of the memory storage arrays of the first and second microelectronic elements 1, 2.

All of the second terminals 126 need not be limited to only carrying address information, although they can be so limited in some embodiments. In an exemplary embodiment, the second terminals 126 can be configured to carry clock signals and all of the command signals, address signals, and bank address signals transferred to the microelectronic package 100, the command signals being write enable, row address strobe, and column address strobe, and the clock signals being clocks used for sampling signals carrying the address information or time multiplexed versions thereof. In a particular example, the second terminals 126 can be configured to carry all of the command signals transferred to the microelectronic package, the command signals being write enable, row address strobe, and column address strobe signals.

In the microelectronic package 100, the first microelectronic element 1 which has its element contacts 104 oriented towards the south and north peripheral edges 132, 130 of the substrate 102, can be electrically coupled with terminals 124 adjacent the south and north peripheral edges. More specifically, the first subset 151 of first terminals 125 adjacent the south peripheral edge 132 can be electrically coupled with the first contacts 141 adjacent the first edge 111 of the first microelectronic element 1. Also, the first subset 152 of second terminals 126 adjacent the north peripheral edge 130 can be electrically coupled with the second contacts 142 adjacent the second edge 113 of the first microelectronic element 1.

The first subset 152 of second terminals 126 adjacent the north peripheral edge 130 can be configured to carry control information for the first microelectronic element 1, and the first subset 151 of first terminals 125 adjacent the south peripheral edge 132 can be configured to transfer data signals in accordance with the control information for the first microelectronic element. Also, the first subset 152 of second terminals 126 adjacent the north peripheral edge 130 can be configured to carry address information for the first microelectronic element 1, and the first subset 151 of first terminals 125 adjacent the south peripheral edge 132 can be configured to transfer data signals to memory storage array locations for the first microelectronic element specified by the address information.

The second microelectronic element 2 which has its element contacts 104 oriented towards the east and west peripheral edges 136, 134 of the substrate 102, can be electrically coupled with terminals 124 adjacent the east and west peripheral edges. More specifically, the second subset 153 of first terminals 125 adjacent the east peripheral edge 136 can be electrically coupled with the first contacts 143 adjacent the first edge 115 of the second microelectronic element 2. Also, the second subset 154 of second terminals 126 adjacent the west peripheral edge 134 can be electrically coupled with the second contacts 144 adjacent the second edge 117 of the second microelectronic element 2.

The second subset 154 of second terminals 126 adjacent the west peripheral edge 134 can be configured to carry control information for the second microelectronic element 2, and the second subset 153 of first terminals 125 adjacent the east peripheral edge 136 can be configured to transfer data signals in accordance with the control information for the second microelectronic element. Also, the second subset 154 of second terminals 126 adjacent the west peripheral edge 134 can be configured to carry address information for the second microelectronic element 2, and the second subset 153 of first terminals 125 adjacent the east peripheral edge 136 can be configured to transfer data signals to memory storage array locations for the second microelectronic element specified by the address information.

The second terminals 126 can be configured to operate the first microelectronic element 1 independently from the second microelectronic element 2. For example, the microelectronic package 100 can permit the first microelectronic element 1 to be operated independently from the second microelectronic element 2, such that data signals in accordance with the control information for the first microelectronic element 1 can be transferred at a time independent from the data signals in accordance with the control information for the second microelectronic element 2.

Additional microelectronic packages having structures similar to that of the microelectronic package 100 of FIGS. 1A-1C can be found in the co-owned and co-pending patent application Ser. No. 14/075,020, filed Nov. 8, 2013, the disclosure of which is hereby incorporated herein by reference.

Figure 2B:
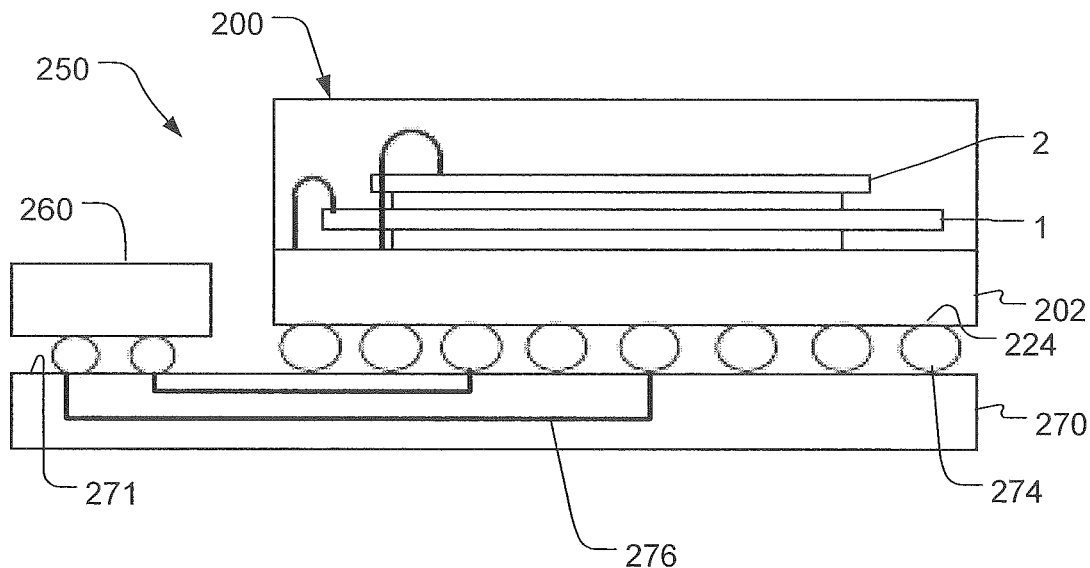
FIG. 2B is an enlarged side elevational view of the microelectronic package of FIG. 2A mounted to a circuit panel, shown with some of the wire bonds omitted, taken from the southwest corner of the package.

FIGS. 2A and 2B illustrate an example implementation of a microelectronic package 200 according to an embodiment herein. The microelectronic package 200 is a variation of the microelectronic package 100 shown in FIGS. 1A-1C. The microelectronic package 200 is similar to the microelectronic package 100, but the edges of the first and second microelectronic elements 1, 2 are oriented at oblique angles with respect to the peripheral edges of the substrate.

Also, the first subset 251 of first terminals 225 (i.e., data information terminals) and the first subset 252 of second terminals 226 (i.e., command/address information terminals) that are electrically coupled with the first microelectronic element 1 are disposed adjacent a first pair of adjacent peripheral edges of the substrate (south and west peripheral edges 232, 234), and the second subset 253 of first terminals and the second subset 254 of second terminals that are electrically coupled with the second microelectronic element 2 are disposed adjacent a second pair of adjacent peripheral edges of the substrate (east and north peripheral edges 236, 230).

Specifically, as can be seen in FIG. 2A, the first and second edges 111, 113 of the first microelectronic element 1 and the first and second edges 115, 117 of the second microelectronic element 2 are oriented at oblique angles with respect to the peripheral edges 130, 132, 134, 136 of the substrate 202. In a particular example, each edge of the first and second microelectronic elements 1, 2 can be oriented at an oblique angle with respect to each of the peripheral edges 130, 132, 134, 136 of the substrate 202. As used herein, an "oblique angle" is defined as an angle between 5 and 85 degrees.

In one embodiment, each edge of the first and second microelectronic elements 1, 2 can be oriented at an at an angle between 30 and 60 degrees with respect to each of the peripheral edges 130, 132, 134, 136 of the substrate 202. In the particular example shown in FIG. 2A, each edge of the first and second microelectronic elements 1, 2 can be oriented at an at an angle of approximately 45 degrees with respect to each of the peripheral edges 130, 132, 134, 136 of the substrate 202.

As shown in FIG. 2A, a first subset 241 of the first terminals 225 that are electrically coupled with the first contacts 151 of the first microelectronic element 1 is disposed adjacent the south peripheral edge 232. A first subset 242 of the second terminals 226 that are electrically coupled with the second contacts 152 of the first microelectronic element 1 are disposed adjacent the west peripheral edge 234, the south and west peripheral edges being adjacent one another.

Also, a second subset 243 of the first terminals 225 that are electrically coupled with the first contacts 153 of the second microelectronic element 2 is disposed adjacent the east peripheral edge 236. A second subset 244 of the second terminals 226 that are electrically coupled with the second contacts 154 of the second microelectronic element 2 are disposed adjacent the north peripheral edge 230, the east and north peripheral edges being adjacent one another.

FIG. 2B shows the microelectronic assembly 200 of FIG. 2A in a microelectronic assembly 250 and its interconnections with a processor 260, both the microelectronic packages and the processor mounted to a support structure such as a circuit panel 270. In the example shown in FIG. 2B, the microelectronic package 250 and the processor 260 can be mounted to a major surface 271 of the circuit panel 270. The microelectronic assembly 250 can also have a set of conductors on the circuit panel 270 configured to carry address information between the microelectronic package 200 and the processor 260. The microelectronic package 200 can have an encapsulant 290 at least partially covering the microelectronic elements 1, 2.

The microelectronic package 200 can have terminals 224 at the second surface 222 of the substrate 202, the terminals being bonded with corresponding panel contacts 274 at the major surface 271 of the circuit panel 270. The terminals 224 of the microelectronic package 200 can include first terminals 225 configured to carry all of the data information usable by circuitry within the within the microelectronic package 200, the data information including data signals. The terminals 224 can also include second terminals 226 configured to carry information other than the data information that is carried by the first terminals 225, such as address information, command information, and control information. The processor 260 can be electrically coupled to the microelectronic package 200 through conductive elements 276 of the circuit panel 270, the conductive elements including the panel contacts 274.

Rotating the edges of the first and second microelectronic elements 1, 2 to form oblique angles with respect to the peripheral edges of the substrate, and having first terminals 225 and second terminals 226 coupled with a particular microelectronic element disposed at adjacent peripheral edges of the substrate may provide the microelectronic package of FIG. 2A with some advantages relative to the microelectronic package of FIGS. 1A-1C.

For example, the configuration of FIG. 2A can permit additional space on the substrate for routing of traces extending between the substrate contacts and the corresponding terminals. The configuration of FIG. 2A can permit the total electrical lead length between first contacts (e.g., data contacts) of a microelectronic element and the corresponding first terminals (e.g., data terminals) of the substrate to have a lower variation between the longest and shortest first contact/terminal pairs compared to the configuration of FIGS. 1A-1C. The configuration of FIG. 2A can also permit the total electrical lead length between second contacts (e.g., command/address information contacts) of a microelectronic element and the corresponding second terminals (e.g., command/address information terminals) of the substrate to have a lower variation between the longest and shortest second contact/terminal pairs compared to the configuration of FIGS. 1A-1C.

In the embodiment of FIG. 2A, rotating the edges of the first and second microelectronic elements 1, 2 to form oblique angles with respect to the peripheral edges of the substrate can permit the variation between the electrical lead length between the longest and shortest first contact/terminal pairs to be lower compared to the configuration of FIGS. 1A-1C. For example, as shown in FIG. 2A, a difference in total electrical length between a shortest lead 255 and a longest lead 256 extending between the first subset of data terminals 251 and the data contacts 141 of the first microelectronic element 1 can be less than 2% of an inverse of a frequency at which the first microelectronic element is configured to operate. In a particular embodiment, a difference in total electrical length between a shortest lead 255 and a longest lead 256 extending between the first subset of data terminals 251 and the data contacts 141 of the first microelectronic element 1 can be less than 1% of an inverse of a frequency at which the first microelectronic element is configured to operate Also in the embodiment of FIG. 2A, the greater distance between some second terminals and each corresponding second contact coupled thereto can permit the variation between the electrical lead length between the longest and shortest second contact/terminal pairs to be lower compared to the configuration of FIGS. 1A-1C. For example, as shown in FIG. 2A, a geometric distance between each second terminal 226 in the second subset 254 and each corresponding second contact 144 of the second microelectronic element 2 coupled thereto can be greater than 25% of a shortest dimension of the first and second dimensions L1, L2 of the microelectronic package 200. In a particular embodiment, a geometric distance between each second terminal 226 in the second subset 254 and each corresponding second contact 144 of the second microelectronic element 2 coupled thereto can be greater than 40% of a shortest dimension of the first and second dimensions L1, L2 of the microelectronic package 200.

With the present arrangement shown in FIG. 2A, the smaller difference between data or address information electrical connections within a particular subset of data contacts/terminals or address information contacts/terminals within the microelectronic package 200 can reduce inductance, and loading from the microelectronic package back onto a command address bus on a circuit panel (e.g., 2B). By reducing these parameters on the command address bus, signals can be received at the microelectronic package 200 at higher speeds than otherwise possible. Accordingly, the package arrangement shown can provide a particular performance advantage, for example, when used with LPDDRx-type microelectronic elements.

Figure 2C:
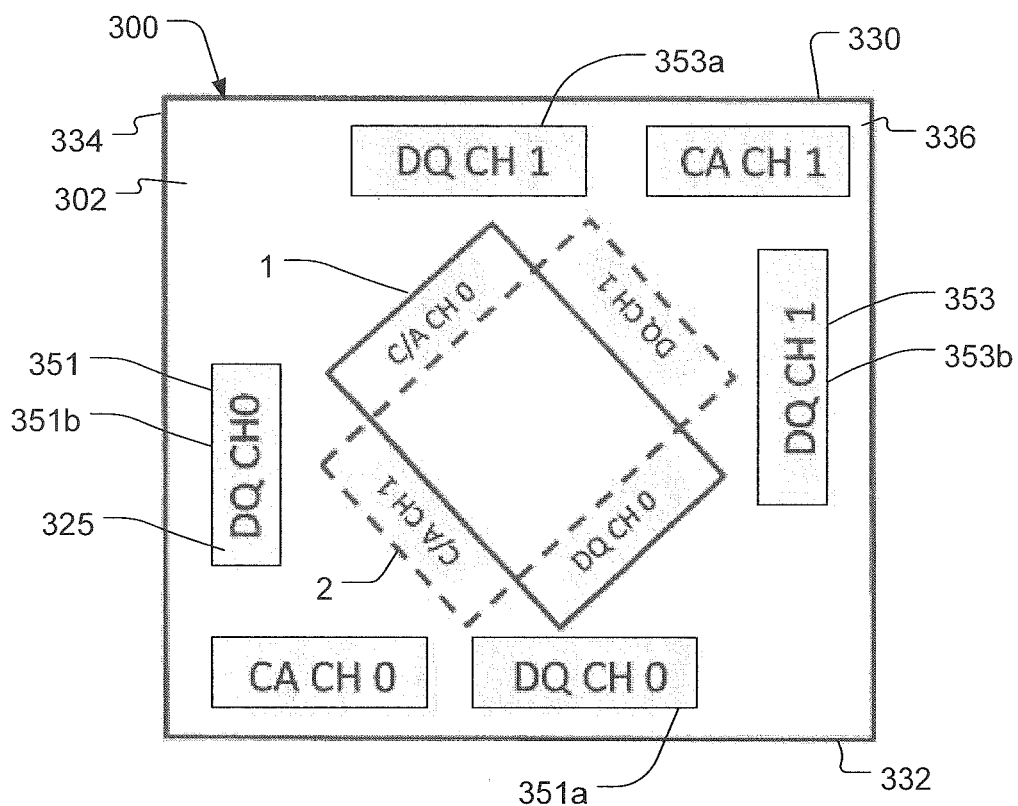
FIG. 2C is a diagrammatic top plan view of a microelectronic package according to yet another embodiment of the present invention.

FIG. 2C illustrates an example implementation of a microelectronic package 300 according to an embodiment herein. The microelectronic package 300 is a variation of the microelectronic package 200 shown in FIGS. 2A and 2B. The microelectronic package 300 is similar to the microelectronic package 200, but a first subset 351 of first terminals 325 (i.e., data information terminals) that are electrically coupled with the first microelectronic element 1 are split into first and second groups 351a, 351b disposed adjacent a first pair of adjacent peripheral edges of the substrate 302 (south and west peripheral edges 332, 334, respectively), and a second subset 353 of first terminals that are electrically coupled with the second microelectronic element 2 are split into first and second groups 353a, 353b disposed adjacent a second pair of adjacent peripheral edges of the substrate (north and east peripheral edges 330, 336, respectively).

Figure 2D:
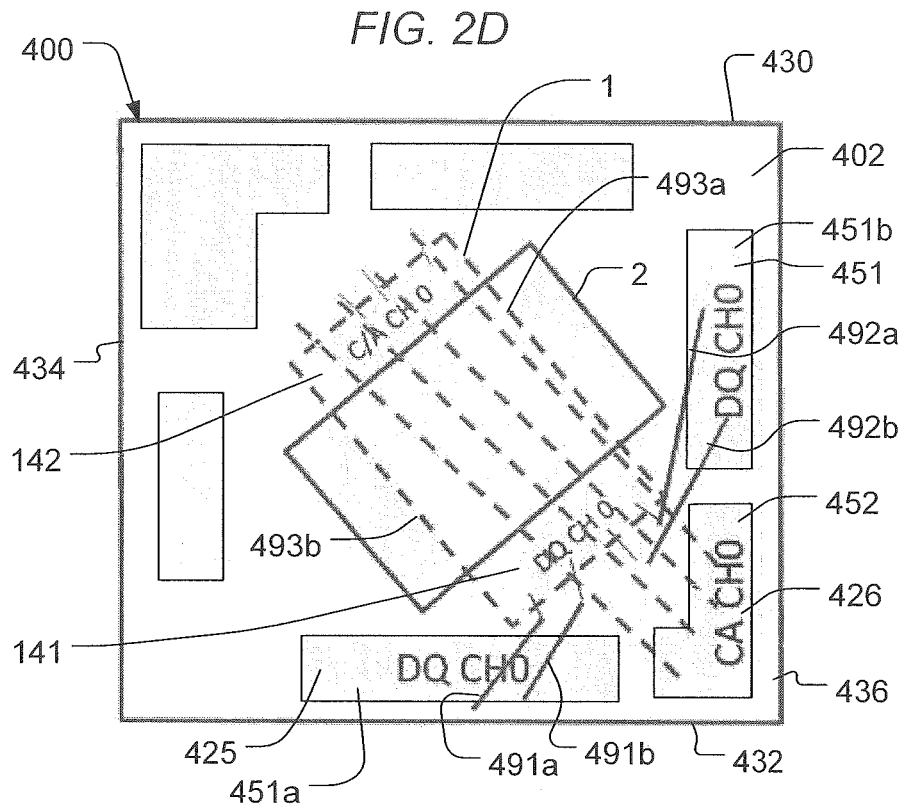
FIG. 2D is a diagrammatic top plan view of a microelectronic package according to still another embodiment of the present invention, showing some of the signal connections to the first microelectronic element.
Figure 2E:
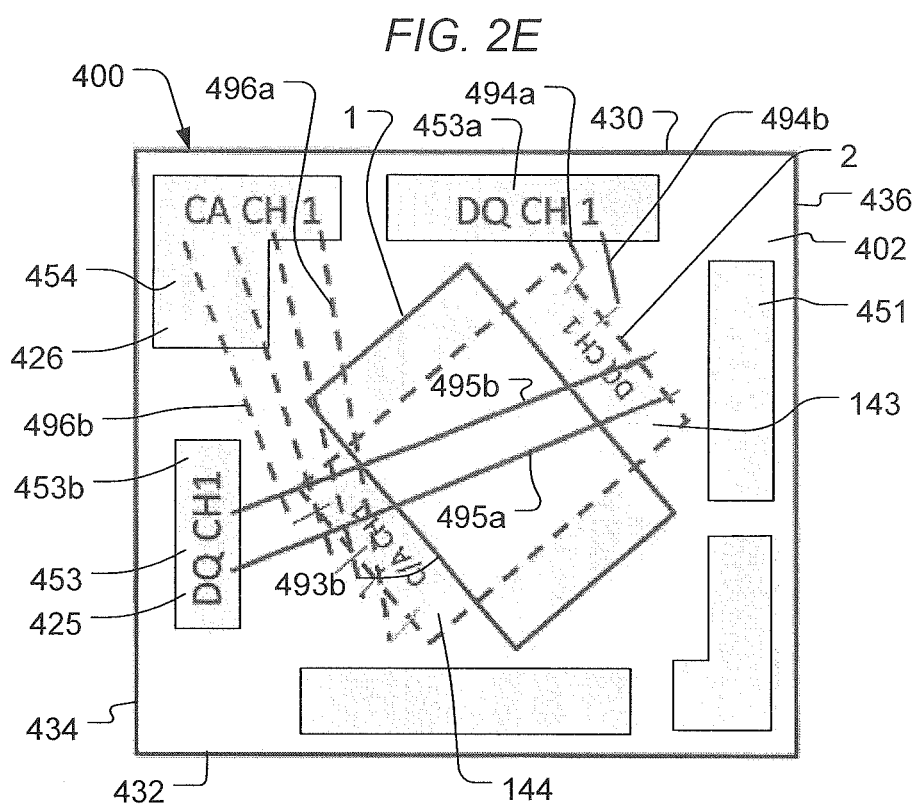
FIG. 2E is a diagrammatic top plan view of the microelectronic package of FIG. 2D, showing some of the signal connections to the second microelectronic element.

FIGS. 2D and 2E illustrate an example implementation of a microelectronic package 400 according to an embodiment herein. The microelectronic package 400 is a variation of the microelectronic package 300 shown in FIG. 2C. The microelectronic package 400 is similar to the microelectronic package 300, but as shown in FIG. 2D, a first subset 452 of second terminals 426 (e.g., command/address information terminals)

that are electrically coupled with the first microelectronic element 1 are disposed in a region adjacent both of a first pair of adjacent peripheral edges of the substrate 402 (south and east peripheral edges 432, 436), and as shown in FIG. 2E, a second subset 454 of second terminals that are electrically coupled with the second microelectronic element 2 are disposed in a region adjacent a second pair of adjacent peripheral edges of the substrate (north and west peripheral edges 430, 434, respectively).

Similar to the microelectronic package 300, the microelectronic package 400 has first and second subsets 451, 453 of first terminals 425 (i.e., data information terminals) that are electrically coupled with the first and second microelectronic elements 1, 2, respectively. The first subset 451 of first terminals 425 are split into first and second groups 451a, 451b disposed adjacent the south and east peripheral edges 432, 436, respectively. The second subset 453 of first terminals 425 are split into first and second groups 453a, 453b disposed adjacent the north and west peripheral edges 430, 434, respectively.

The embodiments of FIGS. 2C and 2D/2E can have many of the same advantages described above with respect to the embodiment of FIGS. 2A and 2B. Rotating the edges of the first and second microelectronic elements 1, 2 to form oblique angles with respect to the peripheral edges of the substrate, and splitting each subset of first terminals into groups disposed against adjacent pairs of peripheral edges of the substrate can permit additional space on the substrate for routing of traces extending between the substrate contacts and the corresponding terminals.

Such features of the embodiments of FIGS. 2C and 2D/2E can also permit the total electrical lead length between a particular group of first or second terminals (451a, 451b, 452, 453a, 453b, 454) and the corresponding first or second contacts of a microelectronic element to have a lower variation between the longest and shortest contact/terminal pairs compared to the configuration of FIGS. 1A-1C.

For example, as shown in FIG. 2D, a difference in total electrical length between a shortest lead 491a and a longest lead 491b extending between the first group 451a of the first subset of first terminals and corresponding ones of the first contacts 141 of the first microelectronic element 1 can be less than 2% of an inverse of a frequency at which the first microelectronic element is configured to operate. Likewise, a difference in total electrical length between a shortest lead 492a and a longest lead 492b extending between the second group 451b of the first subset of first terminals and corresponding ones of the first contacts 141 of the first microelectronic element 1 can be less than 2% of an inverse of a frequency at which the first microelectronic element is configured to operate. Similarly, a difference in total electrical length between a shortest lead 493a and a longest lead 493b extending between the first subset of second terminals 452 and corresponding ones of the second contacts 142 of the first microelectronic element 1 can be less than 2% of an inverse of a frequency at which the first microelectronic element is configured to operate.

As shown in FIG. 2E, a difference in total electrical length between a shortest lead 494a and a longest lead 494b extending between the first group 453a of the second subset of first terminals and corresponding ones of the first contacts 143 of the second microelectronic element 2 can be less than 2% of an inverse of a frequency at which the second microelectronic element is configured to operate. Likewise, a difference in total electrical length between a shortest lead 495a and a longest lead 495b extending between the second group 453b of the second subset of first terminals and corresponding ones of the first contacts 143 of the second microelectronic element 2 can be less than 2% of an inverse of a frequency at which the second microelectronic element is configured to operate. Similarly, a difference in total electrical length between a shortest lead 496a and a longest lead 496b extending between the second subset of second terminals 454 and corresponding ones of the second contacts 144 of the second microelectronic element 2 can be less than 2% of an inverse of a frequency at which the second microelectronic element is configured to operate.

In the embodiment of FIGS. 2D and 2E, the traces that form portions of the leads connecting the first or second terminals of the substrate and the corresponding first or second contacts of the microelectronic elements can be disposed in as few as two substrate routing layers. For example, the traces (including leads 491a, 491b, 492a, 492b, 494a, 494b, 495a, and 495b) shown in solid lines extending between first terminals and corresponding first contacts can be disposed in a first substrate routing layer, and the traces (including leads 493a, 493b, 496a, and 496b) shown in dashed lines extending between second terminals and corresponding second contacts can be disposed in a second substrate routing layer.

Although the microelectronic packages 200, 300, and 400 shown in FIGS. 2A-2E are each shown having two microelectronic elements 1, 2, in other embodiments, the microelectronic packages 200, 300, and 400 may have only a single microelectronic element, such a single microelectronic element having each of its edges oriented at an oblique angle with respect to the peripheral edges of the substrate.

In such an embodiment, the address information terminals of the microelectronic package can be configured to carry address information usable by circuitry within the microelectronic package to determine an addressable memory location from among all the available addressable memory locations of a memory storage array of the single microelectronic element therein.

FIGS. 3A-3E illustrate an example implementation of a microelectronic package 500 according to an embodiment herein. The microelectronic package 500 is a variation of the microelectronic package 200 shown in FIGS. 2A and 2B. The microelectronic package 500 is similar to the microelectronic package 200, but as shown in FIGS. 3A-3D, element contacts of first, second, third, and fourth microelectronic elements 1, 2, 3, 4 are electrically coupled with corresponding subsets of substrate terminals at the west, north, east, and south peripheral edges 534, 530, 536, 532, respectively.

As shown in FIG. 3A, a first subset 551 of first terminals 525 that are electrically coupled with first contacts 141 of the first microelectronic element 1, and a first subset 552 of second terminals 526 that are electrically coupled with second contacts 142 of the first microelectronic element are disposed in respective regions adjacent the west peripheral edge 534. As shown in FIG. 3B, a second subset 553 of first terminals 525 that are electrically coupled with first contacts 143 of the second microelectronic element 2, and a second subset 554 of second terminals 526 that are electrically coupled with second contacts 144 of the second microelectronic element are disposed in respective regions adjacent the north peripheral edge 530.

Figure 3C:
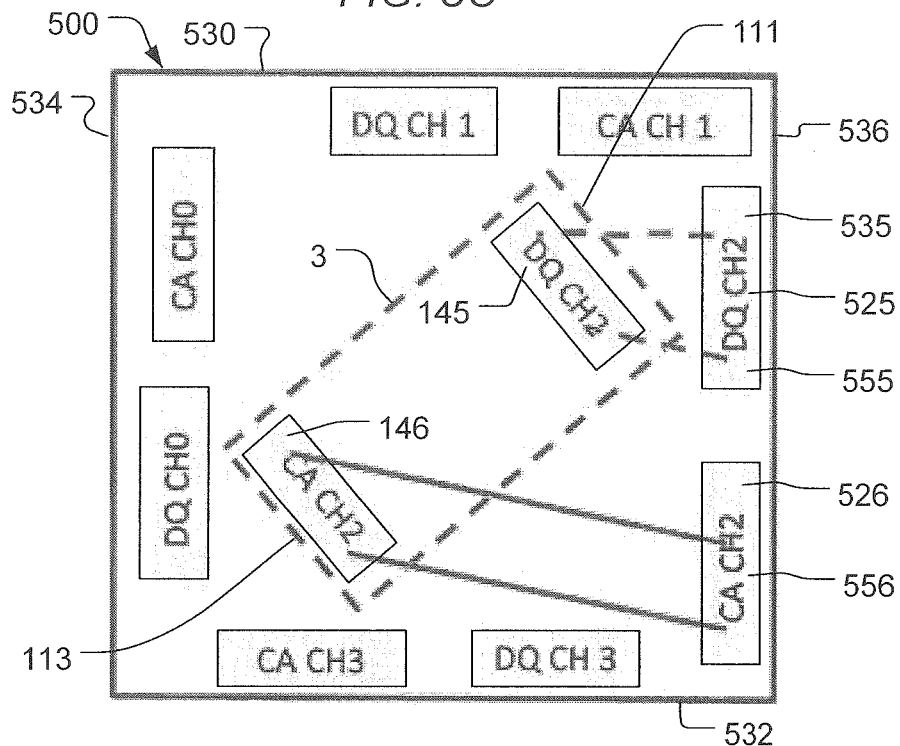
FIG. 3C is a diagrammatic top plan view of the microelectronic package of FIG. 3A, showing some of the signal connections to the third microelectronic element.
Figure 3D:
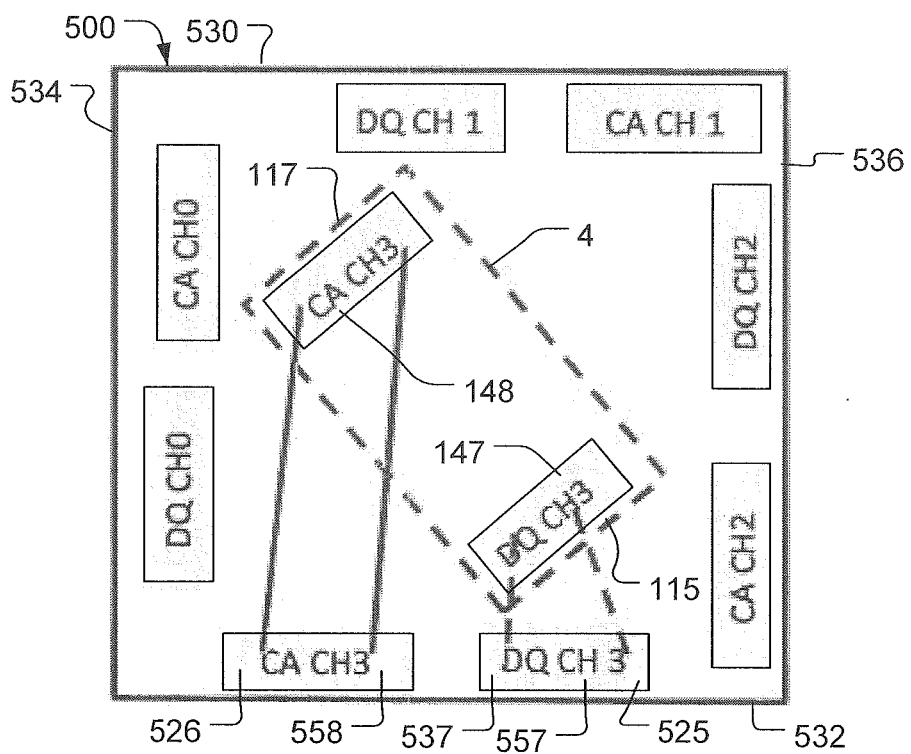
FIG. 3D is a diagrammatic top plan view of the microelectronic package of FIG. 3A, showing some of the signal connections to the fourth microelectronic element.

As shown in FIG. 3C, a third subset 555 of first terminals 525 that are electrically coupled with first contacts 145 of the third microelectronic element 3, and a third subset 556 of second terminals 526 that are electrically coupled with second contacts 146 of the third microelectronic element are disposed in respective regions adjacent the east peripheral edge 536. As shown in FIG. 3D, a fourth subset 557 of first terminals 525 that are electrically coupled with first contacts 147 of the fourth microelectronic element 4, and a fourth subset 558 of second terminals 526 that are electrically coupled with second contacts 148 of the fourth microelectronic element are disposed in respective regions adjacent the south peripheral edge 532.

Figure 3E:
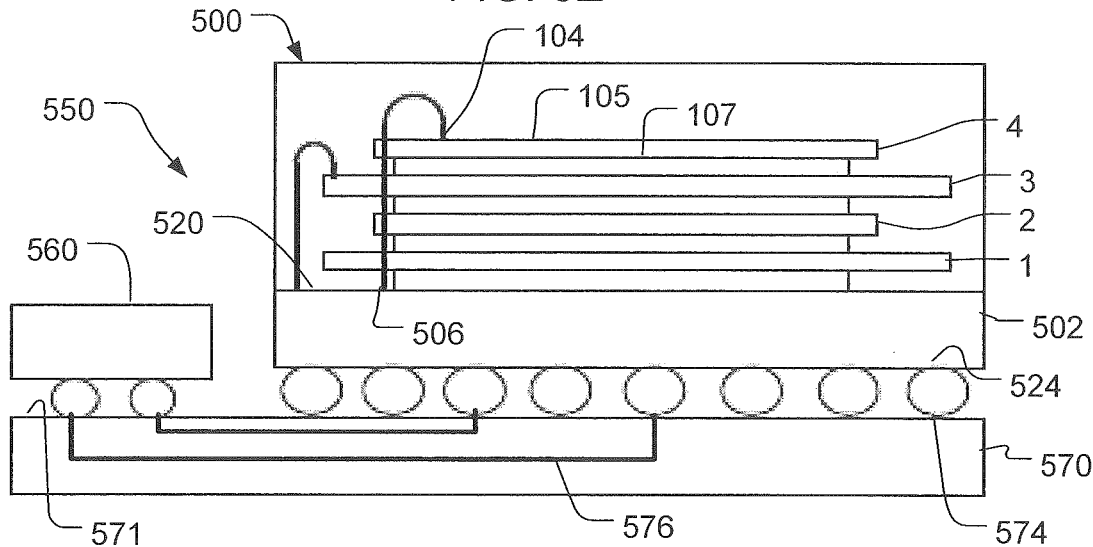
FIG. 3E is an enlarged side elevational view of the microelectronic package of FIGS. 3A-3D mounted to a circuit panel, shown with some of the wire bonds omitted, taken from the southwest corner of the package.

Similar to the embodiments described above, each microelectronic element 1, 2, 3, 4 can have a front face 105 extending parallel to the first surface 520 of the substrate 502, a plurality of edges bounding the front face, and a plurality of element contacts 104 at the front face electrically coupled with terminals 524 of the substrate through contacts of the substrate 506. The microelectronic elements 1, 2, 3, 4 can be arranged in a stack on the same side of the substrate 502. As shown in FIG. 3E, element contacts 104 at a front face 105 of each of the microelectronic elements 1, 2, 3, 4 are wire bonded to corresponding substrate contacts at the first surface 520 of the substrate 502. The wire bonds can extend above the front face 105 of each of the microelectronic elements 1, 2, 3, 4, the wire bonds being electrically coupled to the element contacts 104 of each of the microelectronic elements and the substrate contacts 506.

The microelectronic elements 1, 2, 3, 4 are placed in the stack in an interleaved configuration such that the odd-numbered microelectronic elements (i.e., 1, 3) are spaced by or alternatingly interleaved in a single stacked arrangement with the even-numbered microelectronic elements (i.e., 2, 4). For example, the microelectronic elements 1, 2, 3, 4 are placed in the stack in a configuration such that a rear face 107 of the first microelectronic element 1 opposite the front face 105 thereof can be disposed adjacent the first surface 520 of the substrate 502. The rear face 107 of the second microelectronic element 2 can overlie the front face 105 of the first microelectronic element 1. The rear face 107 of the third microelectronic element 3 can overlie the front face 105 of the second microelectronic element 2, and the rear face 107 of the fourth microelectronic element 4 can overlie the front face 105 of the third microelectronic element.

The microelectronic elements 1, 2, 3, 4 are placed in the stack in a configuration such that the even-numbered microelectronic elements appear to be rotated 90 degrees in their horizontal planes relative to the odd-numbered microelectronic elements. As shown in FIGS. 3A-3D, each of the first and second edges 115, 117 of the second and fourth microelectronic elements 2, 4 are oriented at a perpendicular angle relative to the first and second edges 111, 113 of the first and third microelectronic elements 1, respectively. In a particular embodiment, each of the first and second edges 115, 117 of the second and fourth microelectronic elements 2, can be oriented at an angle between 60 degrees and 120 degrees relative to the first and second edges 111, 113 of the first and third microelectronic elements 1, 3, respectively.

Data signals to and from the microelectronic package 500 can be carried, for example, by DQ signals and data strobe signals DQS corresponding to the respective memory channels. For example, the first subset 551 of first terminals 525 electrically coupled to the first microelectronic element 1 and carrying all of the DQ signals and DQ strobe signals for a first memory channel 531 ("DQ CH 0" in FIG. 3A) can be provided adjacent to the west peripheral edge 534 of the substrate 502. The second subset 553 of first terminals 525 electrically coupled to the second microelectronic element 2 and carrying all of the DQ signals and DQ strobe signals for a second memory channel 533 ("DQ CH 1" in FIG. 3B) can be provided adjacent to the north peripheral edge 530 of the substrate 502.

The third subset 555 of first terminals 525 electrically coupled to the third microelectronic element 3 and carrying all of the DQ signals and DQ strobe signals for a third memory channel 535 ("DQ CH 0" in FIG. 3A) can be provided adjacent to the east peripheral edge 536 of the substrate 502. The fourth subset 557 of first terminals 525 electrically coupled to the fourth microelectronic element 4 and carrying all of the DQ signals and DQ strobe signals for a fourth memory channel 537 ("DQ CH 0" in FIG. 3A) can be provided adjacent to the south peripheral edge 532 of the substrate 502. Each of the first, second, third, and fourth memory channels 531, 533, 535, 537 can be configured to be operated independently from one another.

FIG. 3E shows the microelectronic assembly 500 of FIGS. 3A-3D in a microelectronic assembly 550 and its interconnections with a processor 560, both the microelectronic packages and the processor mounted to a support structure such as a circuit panel 570. In the example shown in FIG. 3E, the microelectronic package 550 and the processor 560 can be mounted to a major surface 571 of the circuit panel 570. The microelectronic assembly 550 can also have a set of conductors on the circuit panel 570 configured to carry address information between the microelectronic package 500 and the processor 560. The microelectronic package 500 can have an encapsulant 590 at least partially covering the microelectronic elements 1, 2, 3, 4.

The microelectronic package 500 can have terminals 524 at the second surface 522 of the substrate 502, the terminals being bonded with corresponding panel contacts 574 at the major surface 571 of the circuit panel 570. The terminals 524 of the microelectronic package 500 can include first terminals 525 configured to carry all of the data information usable by circuitry within the within the microelectronic package 500, the data information including data signals. The terminals 524 can also include second terminals 526 configured to carry information other than the data information that is carried by the first terminals 525, such as address information, command information, and control information. The processor 560 can be electrically coupled to the microelectronic package 500 through conductive elements 576 of the circuit panel 570, the conductive elements including the panel contacts 574.

The embodiments of FIGS. 3A-3E can have many of the same advantages described above with respect to the embodiments of FIGS. 2A-2E. Rotating the edges of the microelectronic elements 1, 2, 3, 4 to form oblique angles with respect to the peripheral edges of the substrate, and disposing each subset of data terminals and address terminals electrically coupled to a particular microelectronic element adjacent a corresponding one of the peripheral edges of the substrate can permit additional space on the substrate for routing of traces extending between the substrate contacts and the corresponding terminals.

Such features of the embodiments of FIGS. 3A-3E can also permit the total electrical lead length between a particular group of first or second terminals and the corresponding first or second contacts of a microelectronic element to have a lower variation between the longest and shortest contact/terminal pairs compared to the configuration of FIGS. 1A-1C.

In the embodiment of FIGS. 3A-3E, the traces that form portions of the leads connecting the first or second terminals of the substrate and the corresponding first or second contacts of the microelectronic elements can be disposed in as few as two substrate routing layers. For example, the traces shown in solid lines extending between first terminals and corresponding first contacts can be disposed in a first substrate routing layer, and the traces shown in dashed lines extending between second terminals and corresponding second contacts can be disposed in a second substrate routing layer.

Figure 4A:
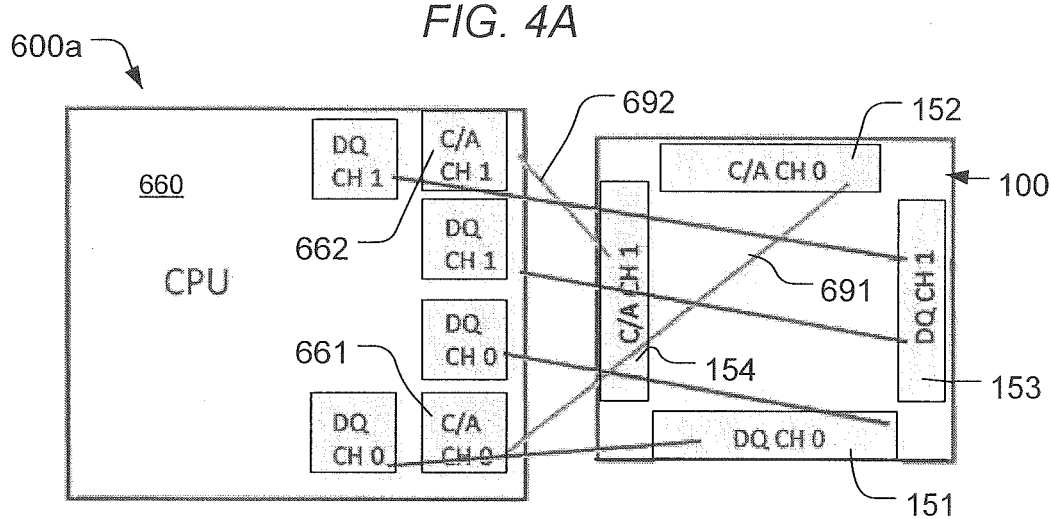
FIG. 4A is a schematic diagram illustrating a possible interconnection arrangement of the microelectronic package of FIGS. 1A-1C in a system and its interconnections with a processor.

FIG. 4A shows the microelectronic assembly 600a, which is a possible interconnection arrangement of the microelectronic package 100 of FIGS. 1A-1C in a system and its interconnections with a processor 660. The first subset 151 of first terminals (i.e., data information terminals) are positioned at the south peripheral edge of the substrate opposite the first subset 152 of second terminals (e.g., address information terminals) at the north peripheral edge, and the second subset 153 of first terminals are positioned at the east peripheral edge of the substrate opposite the second subset 154 of second terminals at the west peripheral edge.

With this configuration of terminals, leads 691 extending between the first subset 152 of second terminals of the microelectronic package 100 and a first subset 661 of second terminals (e.g., address information terminals) of a processor 660 are much longer than leads 692 extending between the second subset 154 of second terminals of the microelectronic package and a corresponding second subset 662 of second terminals of the processor.

Figure 4B:
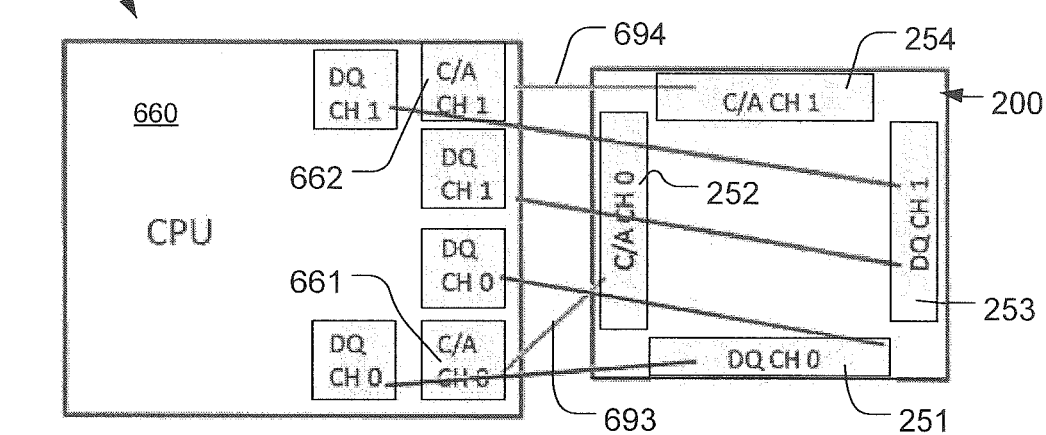
FIG. 4B is a schematic diagram illustrating a possible interconnection arrangement of the microelectronic package of FIG. 2A in a system and its interconnections with a processor.

FIG. 4B shows the microelectronic assembly 600b, which is a possible interconnection arrangement of the microelectronic package 200 of FIGS. 2A and 2B in a system and its interconnections with a processor 660. The first subset 251 of first terminals are positioned at the south peripheral edge of the substrate adjacent the first subset 252 of second terminals at the west peripheral edge, and the second subset 253 of first terminals are positioned at the east peripheral edge of the substrate adjacent the second subset 254 of second terminals at the north peripheral edge.

With this configuration of terminals of FIG. 4B, the leads 693 extending between the first subset 252 of second terminals of the microelectronic package 200 and the first subset 661 of second terminals of the processor 660 (e.g., address information terminals) are much closer in length (compared to FIG. 4A) to the leads 694 extending between the second subset 254 of second terminals of the microelectronic package and the corresponding second subset 662 of second terminals of the processor.

With arrangement of FIG. 4B, the shorter address information electrical connections between the microelectronic package 200 and the processor 660 can reduce signal propagation time, inductance, and loading from the microelectronic package back onto a command address bus on a circuit panel (e.g., FIG. 2B). By reducing these parameters on the command address bus, signals can be received at the microelectronic package 200 at higher speeds than otherwise possible. Accordingly, the package arrangement shown provides a particular performance advantage when used with LPDDRx-type microelectronic elements.

FIG. 5A shows the microelectronic assembly 700a, which is a possible interconnection arrangement of the microelectronic package 100 of FIGS. 1A-1C in another system and its interconnections with another processor 760. The first and second terminals are positioned in the same locations as the first and second terminals in the microelectronic package 100 shown in FIG. 4A.

With this configuration of terminals, leads 791 extending between the first subset 152 of second terminals of the microelectronic package 100 and a first subset 761 of second terminals (e.g., address information terminals) of a processor 760 are much longer than leads 792 extending between the second subset 154 of second terminals of the microelectronic package and a corresponding second subset 762 of second terminals of the processor. Leads 793 extending between the first and second subsets of first terminals 151, 153 and corresponding first terminals (i.e., data information terminals) of the processor 760 are relatively compressed toward the south edge 132 of the microelectronic package 100 and the south edge 765 of the processor 760.

FIG. 5B shows the microelectronic assembly 700b, which is a possible interconnection arrangement of the microelectronic package 300 of FIG. 2C in a system and its interconnections with a processor 760. The first and second groups 351a, 351b of the first subset of first terminals are positioned at the south and west peripheral edges of the substrate adjacent the first subset 352 of second terminals at the south peripheral edge, and the first and second groups 353a, 353b of the second subset of first terminals are positioned at the north and east peripheral edges of the substrate adjacent the second subset 354 of second terminals at the north peripheral edge.

With this configuration of terminals of FIG. 5B, the leads 794 extending between the first subset 352 of second terminals of the microelectronic package 300 and the first subset 761 of second terminals (e.g., address information terminals) of the processor 760 are much closer in length (compared to FIG. 5A) to the leads 795 extending between the second subset 354 of second terminals of the microelectronic package and the corresponding second subset 762 of second terminals of the processor. Also, leads 796 extending between the first and second subsets of first terminals 351, 353 and corresponding first terminals (i.e., data information terminals) of the processor 760 are more spread out (compared to FIG. 5A) between the north and south edges 130, 132 of the microelectronic package 100 and the north and south edges 765, 766 of the processor.

With the arrangement of FIG. 5B, the shorter address information electrical connections between the microelectronic package 300 and the processor 760 can produce similar benefits as described above with reference to FIG. 4B. Also, the additional space for routing of leads 794, 795, and 796 (compared to FIG. 5A) may permit the microelectronic assembly 700b to have a fewer number of routing layers in a circuit panel to which the microelectronic package 300 and the processor 760 can be mounted, or it may permit the leads 794, 795, and 796 to be shorter in length (compared to FIG. 5A).

FIG. 6 further illustrates a common arrangement of element contacts 104 at the front face 105 of an LPDDRx-type microelectronic element (e.g., contact pads provided at the front face of a memory microelectronic element in accordance with LPDDRx) that can be used in the microelectronic packages of FIGS. 1A-3E. This arrangement of element contacts 104 shows the second contacts (e.g., address, command, control information contacts) in a first column 110 or 114 adjacent one edge of the microelectronic element, and the first contacts (i.e., data information contacts) in a second column 112 or 116 adjacent an opposite edge of the microelectronic element.

Figure 7:
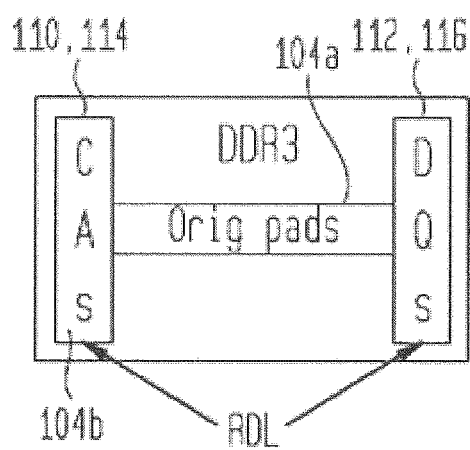
FIG. 7 is a diagrammatic top plan view of another microelectronic element that can be included in the microelectronic package of FIGS. 1A-3E.

Referring to FIG. 7, by contrast, DDRx microelectronic elements (which can be used in the microelectronic packages of FIGS. 1A-3E) typically have central chip contacts 104a as originally provided in which the chip contacts extend in one or two rows along or adjacent to a central 'axis' of the microelectronic element. In such case, a redistribution layer can be provided or formed on the chip that redistributes the contacts from the central spine to opposite edges, thereby providing element contacts 104b for carrying address information or command/control/address information in a first column 110 or 114 adjacent one edge of the microelectronic element, and element contacts for carrying data signals in a second column 112 or 116 adjacent an opposite edge of the microelectronic element.

Figure 8:
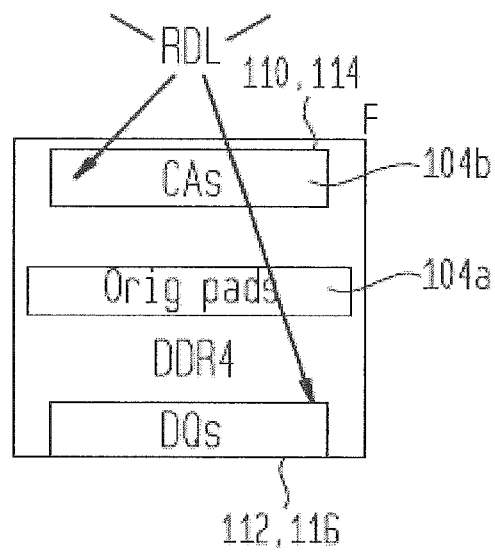
FIG. 8 is a diagrammatic top plan view of yet another microelectronic element that can be included in the microelectronic package of FIGS. 1A-3E.

FIG. 8 further illustrates that for some DDRx chips, for example, DDR3 or DDR4 chips (which can be used in the microelectronic packages of FIGS. 1A-3E), the redistribution can be made in the manner shown in which the original central chip contacts 104a are in the middle and the element contacts 104b for carrying address information or command/control/address information in a first column 110 or 114 adjacent one edge of the microelectronic element, and the element contacts for carrying data signals in a second column 112 or 116 adjacent an opposite edge of the microelectronic element, the first and second columns of element contacts extending along the edges parallel to the central axis of the original central chip contacts as shown.

Figure 9:
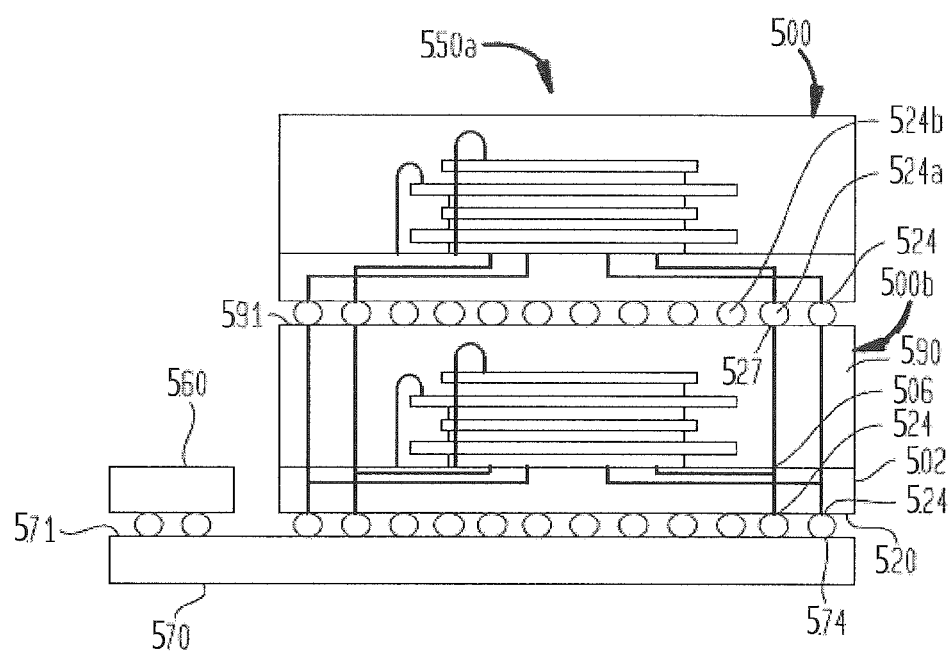
FIG. 9 is a schematic diagram illustrating a possible interconnection arrangement of the microelectronic package of FIGS. 3A-3E in a package-on-package system.

FIG. 9 is a schematic diagram illustrating a possible interconnection arrangement of an upper microelectronic package 500 (FIGS. 3A-3E) stacked with a lower microelectronic package 500b in a microelectronic assembly 550a and its interconnections with a processor 560, both the microelectronic packages and the processor mounted to a support structure such as a circuit panel 570. In the example shown in FIG. 9, the lower microelectronic package 500b and the processor 560 can be mounted to a major surface 571 of the circuit panel 570, and the upper microelectronic package 500 can be mounted to the lower microelectronic package. The microelectronic assembly 550a can also have a set of conductors on the support structure 570 configured to carry the address information between the microelectronic packages and the processor 560.

The lower microelectronic package 500b can have terminals 524 (bottom terminals) at the second surface 522 of the substrate 502. The lower microelectronic package can have an encapsulant 590 at least partially covering the microelectronic elements. In one example, top terminals 527 at a top surface 591 of the encapsulant can be electrically coupled with the microelectronic elements of the lower microelectronic package via the substrate contacts 506. In other embodiments, the lower microelectronic package 500b can have top terminals that are exposed at a surface of the substrate 502, or other locations. The terminals 524 of the upper microelectronic package 500 can be joined to the top terminals 527 of the lower microelectronic package 500b. In one example, the upper microelectronic package 500 may take the form of the lower microelectronic package 500b (with both top and bottom terminals), such that the upper and lower microelectronic packages are identical except for the location of chip select terminals.

In a particular embodiment, the terminals 524 of each of the upper and lower microelectronic packages 500, 500b can include first terminals configured to carry all of the data information usable by circuitry within the within the respective microelectronic package, the data information including data signals. The circuit panel 570 of the microelectronic assembly 550a can have a set of conductors configured to carry 64 bits of the data information between the microelectronic packages 500, 500b and the processor 560, where the first terminals of the upper microelectronic package are configured to transfer 32 bits per clock cycle to the set of conductors, and the first terminals of the lower microelectronic package are configured to transfer 32 bits per clock cycle to the set of conductors.

Figure 10A:
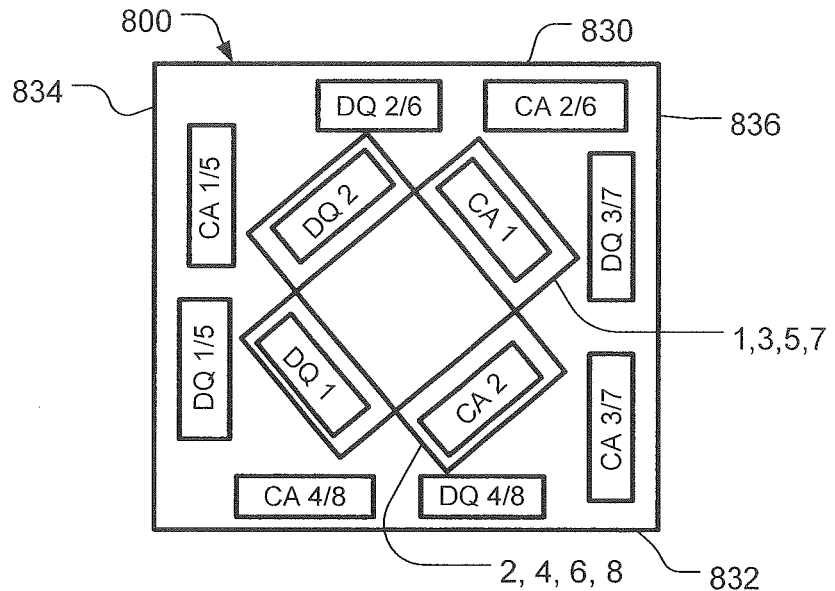
FIG. 10A is a diagrammatic top plan view of a microelectronic package having eight microelectronic elements, according to another embodiment of the present invention, with the signal connections between the microelectronic elements and the substrate omitted.
Figure 10B:
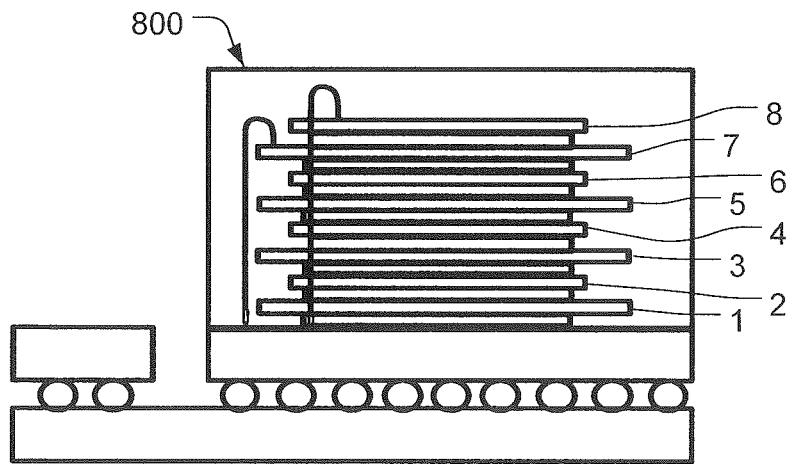
FIG. 10B is an enlarged side elevational view of the microelectronic package of FIG. 10A mounted to a circuit panel, shown with some of the wire bonds omitted, taken from the southwest corner of the package.

FIGS. 10A and 10B illustrates an example implementation of a microelectronic package 800 according to an embodiment herein. The microelectronic package 800 is a variation of the microelectronic package 300 shown in FIGS. 3A-3E. The microelectronic package 800 is similar to the microelectronic package 300, but element contacts of first, second, third, and fourth microelectronic elements 1, 2, 3, 4 are electrically coupled with corresponding subsets of substrate terminals at the west, north, east, and south peripheral edges 834, 830, 836, 832, respectively, and element contacts of fifth, sixth, seventh, and eighth microelectronic elements 5, 6, 7, and 8 are electrically coupled with the same corresponding subsets of substrate terminals at the west, north, east, and south peripheral edges 834, 830, 836, 832, respectively, with the exception of the terminals configured to receive control information, i.e., chip select (CS), clock enable (CKE), and on die termination (ODT).

More specifically, the first and fifth microelectronic elements 1 and 5 are both electrically coupled with the same corresponding subsets of first and second substrate terminals at the west peripheral edge 834, the second and sixth microelectronic elements 2 and 6 are both electrically coupled with the same corresponding subsets of first and second substrate terminals at the north peripheral edge 830, the third and seventh microelectronic elements 3 and 7 are both electrically coupled with the same corresponding subsets of first and second substrate terminals at the east peripheral edge 836, and the fourth and eighth microelectronic elements 4 and 8 are both electrically coupled with the same corresponding subsets of first and second substrate terminals at the south peripheral edge 832. As noted above, each pair of microelectronic elements that are electrically coupled with a common set of first and second substrate terminals are connected to separate control information terminals (i.e., CS, CKE, ODT), which are configured to select which one of the pair of microelectronic elements will receive a particular data, address, or command information signal, for example.

In the embodiment of FIGS. 10A and 10B, the package 800 can be configured to have two channels and two ranks of memory storage. For example, if each of the microelectronic elements 1-8 is configured to receive 32 bits of data information twice per clock cycle (e.g., LPDDRx), then microelectronic elements 1 and 2 can comprise a first 64-bit memory channel in a first rank, and microelectronic elements 3 and 4 can together comprise a second 64-bit memory channel in the first rank, and microelectronic elements 5 and 6 can comprise a first 64-bit memory channel in a second rank, and microelectronic elements 7 and 8 can comprise a second 64-bit memory channel in the second rank.

Figure 11:
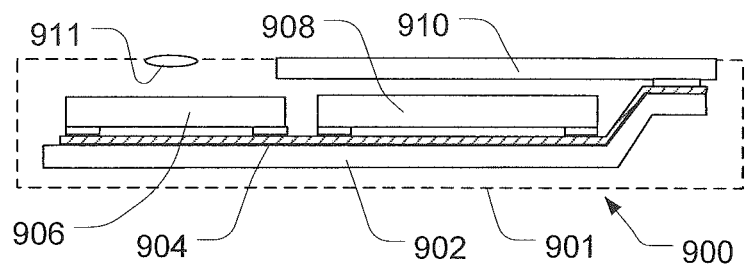
FIG. 11 is a schematic depiction of a system according to one embodiment of the invention.

The microelectronic packages and microelectronic assemblies described above with reference to FIGS. 1A through 10 above can be utilized in construction of diverse electronic systems, such as the system 900 shown in FIG. 11. For example, the system 900 in accordance with a further embodiment of the invention includes a plurality of modules or components 906 such as the microelectronic packages or microelectronic assemblies as described above, in conjunction with other electronic components 908, 910 and 911.

In the exemplary system 900 shown, the system can include a circuit panel, motherboard, or riser panel 902 such as a flexible printed circuit board, and the circuit panel can include numerous conductors 904, of which only one is depicted in FIG. 11, interconnecting the modules or components 906, 908, 910 with one another. Such a circuit panel 902 can transport signals to and from each of the microelectronic packages and/or microelectronic assemblies included in the system 900. However, this is merely exemplary; any suitable structure for making electrical connections between the modules or components 906 can be used.

In a particular embodiment, the system 900 can also include a processor such as the semiconductor chip 908, such that each module or component 906 can be configured to transfer a number N of data bits in parallel in a clock cycle, and the processor can be configured to transfer a number M of data bits in parallel in a clock cycle, M being greater than or equal to N.

In the example depicted in FIG. 11, the component 908 is a semiconductor chip and component 910 is a display screen, but any other components can be used in the system 900. Of course, although only two additional components 908 and 911 are depicted in FIG. 11 for clarity of illustration, the system 900 can include any number of such components.

Modules or components 906 and components 908 and 911 can be mounted in a common housing 901, schematically depicted in broken lines, and can be electrically interconnected with one another as necessary to form the desired circuit. The housing 901 is depicted as a portable housing of the type usable, for example, in a cellular telephone or personal digital assistant, and screen 910 can be exposed at the surface of the housing. In embodiments where a structure 906 includes a light-sensitive element such as an imaging chip, a lens 911 or other optical device also can be provided for routing light to the structure. Again, the simplified system shown in FIG. 11 is merely exemplary; other systems, including systems commonly regarded as fixed structures, such as desktop computers, routers and the like can be made using the structures discussed above.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

It will be appreciated that the various dependent claims and the features set forth therein can be combined in different ways than presented in the initial claims. It will also be appreciated that the features described in connection with individual embodiments may be shared with others of the described embodiments.

The invention claimed is:

1. A microelectronic package, comprising:

a substrate comprising a dielectric element having first and second opposite surfaces, a plurality of peripheral edges extending between the first and second surfaces defining a generally rectangular or square periphery of the substrate, and comprising a plurality of contacts and terminals, the contacts being at the first surface, the terminals being at at least one of the first or second surfaces, the terminals including first terminals and second terminals; and first and second microelectronic elements in a stack on a same side of the first surface, each microelectronic element having a face extending parallel to the first surface, a plurality of edges bounding the face, and a plurality of element contacts at the face electrically coupled with the terminals through the contacts of the substrate, the element contacts of each microelectronic element including first and second contacts electrically coupled to the respective first and second terminals, all of the first contacts within a first connection region adjacent to a first edge of the edges of the respective microelectronic element, and all of the second contacts within a second connection region adjacent to a second edge of the edges of the respective microelectronic element opposite the first edge, wherein each edge of each microelectronic element is oriented at an oblique angle with respect to the peripheral edges of the substrate, and each of the first and second edges of the second microelectronic element are oriented at an angle between 60 degrees and 120 degrees relative to the first and second edges of the first microelectronic element, respectively, wherein the first contacts and the first terminals are configured to carry data information including data signals, and the second contacts and the second terminals are configured to carry address information, and wherein a difference in total electrical length between a shortest lead and a longest lead extending between the first terminals and the first contacts is less than 2% of an inverse of a frequency at which the microelectronic element is configured to operate.

2. The microelectronic package as claimed in claim 1, wherein each edge of the microelectronic element is oriented at an angle between 30 and 60 degrees with respect to each of the peripheral edges of the substrate.

3. The microelectronic package as claimed in claim 1, wherein the face of the microelectronic element is a front face and the microelectronic element has a rear face opposite the front face and facing the first surface of the substrate, and the element contacts are electrically coupled with the contacts of the substrate by wire bonds extending above the front face.

4. The microelectronic package as claimed in claim 1, wherein all of the first terminals electrically coupled to the first contacts are at positions within a third connection region adjacent to a first peripheral edge of the peripheral edges of the substrate, and all of the second terminals electrically coupled to the second contacts are at positions within a fourth connection region adjacent to a second peripheral edge of the peripheral edges of the substrate, the first and second peripheral edges being adjacent to one another.

5. The microelectronic package as claimed in claim 1, wherein all of the first terminals electrically coupled to the first contacts are at positions within a third connection region adjacent to a first peripheral edge of the peripheral edges of the substrate, and all of the second terminals electrically coupled to the second contacts are at positions within a fourth connection region adjacent to the first peripheral edge of the substrate.

6. The microelectronic package as claimed in claim 1, wherein each surface of the substrate has first and second dimensions in orthogonal directions, and a geometric distance between each second terminal and each corresponding second contact coupled thereto is greater than 25% of a shortest dimension of the first and second dimensions of the microelectronic package.

7. The microelectronic package as claimed in claim 1, wherein the second terminals are configured to carry address information usable by circuitry within the microelectronic package to determine an addressable memory location from among all the available addressable memory locations of a memory storage array of the microelectronic element.

8. The microelectronic package as claimed in claim 7, wherein the second terminals are configured to carry all of the command signals transferred to the microelectronic package, the command signals being write enable, row address strobe, and column address strobe signals.

9. The microelectronic package as claimed in claim 1, wherein a difference in total electrical length between a shortest lead and a longest lead extending between the first terminals and the first contacts is less than 1% of an inverse of a frequency at which the microelectronic element is configured to operate.

10. The microelectronic package as claimed in claim 1, wherein the edges of each of the microelectronic elements include a third edge extending between the first and second edges thereof, and a fourth edge extending between the first and second edges thereof, each fourth edge opposite from the respective third edge, wherein the first edge of the first microelectronic element extends beyond the third edge of the second microelectronic element and the second edge of the first microelectronic element extends beyond the fourth edge of the second microelectronic element.

11. The microelectronic package as claimed in claim 1, wherein the face of each microelectronic element is a front face and each microelectronic element has a rear face opposite the respective front face and facing the first surface of the substrate, and the element contacts of each microelectronic element are electrically coupled with the contacts of the substrate by wire bonds extending above the respective front face.

12. The microelectronic package as claimed in claim 1, wherein each of the first and second edges of the second microelectronic element are oriented at a perpendicular angle relative to the first and second edges of the first microelectronic element, respectively.

13. The microelectronic package as claimed in claim 1, wherein a first subset of the first terminals that are electrically coupled to the first microelectronic element comprises a first memory channel, a second subset of the first terminals that are electrically coupled to the second microelectronic element comprises a second memory channel, and the first and second memory channels are configured to be operated independently from one another.

14. The microelectronic package as claimed in claim 1, wherein the microelectronic package further includes third and fourth microelectronic elements in the stack with the first and second microelectronic elements on the same side of the first surface as the first and second microelectronic elements, the third and fourth microelectronic elements each having a face and a plurality of edges bounding the face, and a plurality of element contacts at the face electrically coupled with the terminals through the contacts of the substrate, wherein the element contacts of each of the third and fourth microelectronic elements include first contacts configured to carry data information including data signals and second contacts being configured to carry address information, the first contacts being at positions of at least one row of contacts adjacent to and parallel to a first edge of the edges of the respective microelectronic element, and the second contacts being at positions of at least one row of contacts adjacent to and parallel to a second edge of the edges of the respective microelectronic element opposite the first edge, and wherein the first contacts of each of the third and fourth microelectronic elements are electrically coupled to the first terminals, and the second contacts of the third and fourth microelectronic elements are electrically coupled to the second terminals.

15. The microelectronic package as claimed in claim 14, wherein first, second, third, and fourth subsets of the first terminals that are electrically coupled to the respective first, second, third, and fourth microelectronic elements comprise respective first, second, third, and fourth memory channels, and the memory channels are configured to be operated independently from one another.

16. The microelectronic package as claimed in claim 15, wherein the first, second, third, and fourth subsets of the first terminals are disposed adjacent respective first, second, third, and fourth ones of the peripheral edges of the substrate.

17. The microelectronic package as claimed in claim 1, wherein the terminals are bottom terminals, the microelectronic package further comprising an encapsulant at least partially covering the microelectronic element and top terminals at a top surface of the encapsulant electrically coupled with the microelectronic element via the contacts of the substrate.

18. A microelectronic assembly comprising the microelectronic package as claimed in claim 1, the microelectronic assembly further comprising a processor and a circuit panel having panel contacts, wherein the terminals of the microelectronic package are bonded to the panel contacts, and the processor is electrically coupled to the microelectronic package through conductive elements of the circuit panel.

19. A system comprising the microelectronic package as claimed in claim 1 and one or more other electronic components electrically connected to the microelectronic package.

20. The system as claimed in claim 19, further comprising a housing, the microelectronic package and the other electronic components being mounted to the housing.

21. A microelectronic package, comprising:
a substrate comprising a dielectric element having first and second opposite surfaces, a plurality of peripheral edges extending between the first and second surfaces defining a generally rectangular or square periphery of the substrate, and comprising a plurality of contacts and terminals, the contacts being at the first surface, the terminals being at at least one of the first or second surfaces; and first and second microelectronic elements in a stack on a same side of the first surface, each microelectronic element having a face extending parallel to the first surface, a plurality of edges bounding the face, and a plurality of element contacts at the face electrically coupled with the terminals of the substrate, wherein each edge of each microelectronic element is oriented at an oblique angle with respect to the peripheral edges of the substrate, and each of the first and second edges of the second microelectronic element are oriented at an angle between 60 degrees and 120 degrees relative to the first and second edges of the first microelectronic element, respectively.

22. The microelectronic package as claimed in claim 21, wherein the element contacts include first contacts and second contacts, and the terminals include first terminals and second terminals, the first contacts and the first terminals being configured to carry data information including data signals, the second contacts and the second terminals being configured to carry address information, all of the first contacts being at positions within a first connection region adjacent to a first edge of the edges of the microelectronic element, and all of the second contacts being at positions within a second connection region adjacent to a second edge of the edges of the microelectronic element opposite the first edge, the first contacts being electrically coupled to the first terminals, and the second contacts being electrically coupled to the second terminals.

23. The microelectronic package as claimed in claim 22, wherein a difference in total electrical length between a shortest lead and a longest lead extending between the first terminals and the first contacts is less than 2% of an inverse of a frequency at which the microelectronic element is configured to operate.

* * * * *